United States Patent
Schweitzer, III et al.

(10) Patent No.: US 8,990,036 B1
(45) Date of Patent: Mar. 24, 2015

(54) POWER LINE PARAMETER ADJUSTMENT AND FAULT LOCATION USING TRAVELING WAVES

(71) Applicant: Schweitzer Engineering Laboratories, Inc., Pullman, WA (US)

(72) Inventors: Edmund O. Schweitzer, III, Pullman, WA (US); Mangapathirao Venkata Mynam, Pullman, WA (US); Armando Guzman-Casillas, Pullman, WA (US); Veselin Skendzic, Schwenksville, PA (US); Bogdan Z. Kasztenny, Markham (CA); David E. Whitehead, Pullman, WA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 0 days.

(21) Appl. No.: 14/486,929

(22) Filed: Sep. 15, 2014

Related U.S. Application Data

(60) Provisional application No. 61/878,524, filed on Sep. 16, 2013.

(51) Int. Cl.
    *G06F 19/00*     (2011.01)
    *G01R 31/08*     (2006.01)
    *G01R 31/11*     (2006.01)

(52) U.S. Cl.
    CPC .............. *G01R 31/088* (2013.01); *G01R 31/11* (2013.01)
    USPC .......................................................... 702/58

(58) Field of Classification Search
    CPC ... C12Q 1/6825; H04I 67/12; G01S 2007/403
    USPC ................................. 702/58, 64, 66, 182–185
    See application file for complete search history.

(56) References Cited

U.S. PATENT DOCUMENTS

| | | | |
|---|---|---|---|
| 3,585,298 | A | 6/1971 | Liberman |
| 3,878,460 | A | 4/1975 | Nimmersjö |
| 3,890,544 | A | 6/1975 | Chamia |
| 3,956,671 | A | 5/1976 | Nimmersjö |
| 4,053,816 | A | 10/1977 | Nimmersjö |

(Continued)

FOREIGN PATENT DOCUMENTS

| | | |
|---|---|---|
| EP | 226210 | 12/1986 |
| EP | 241832 | 7/1990 |

(Continued)

OTHER PUBLICATIONS

Harshad Mehta, Fault Location Techniques for High-Voltage DC Lines, EPRI EL-4331 Project 2150-1, 1985.

(Continued)

*Primary Examiner* — Edward Raymond
(74) *Attorney, Agent, or Firm* — Richard M. Edge; Jared L. Cherry

(57) ABSTRACT

Fault location using traveling waves in an electric power delivery system according to the embodiments herein uses line parameters that are adjusted using traveling wave reflections from known discontinuities in the electric power delivery system. The arrival times of a traveling wave and a reflection of the traveling wave from a known discontinuity may be used to adjust parameters of the electric power delivery system such as, for example, line length. The adjusted parameter can then be used to more accurately calculate the location of the fault using the traveling waves.

21 Claims, 16 Drawing Sheets

(56) References Cited

U.S. PATENT DOCUMENTS

| | | | |
|---|---|---|---|
| 4,254,444 | A | 3/1981 | Eriksson |
| 4,296,452 | A | 10/1981 | Eriksson et al. |
| 4,351,011 | A | 9/1982 | Liberman |
| 4,377,834 | A | 3/1983 | Eriksson |
| 4,766,549 | A | 8/1988 | Schweitzer |
| 4,797,805 | A | 1/1989 | Nimmersjö |
| 4,800,509 | A | 1/1989 | Nimmersjö |
| 5,572,138 | A | 11/1996 | Nimmersjö |
| 5,682,100 | A | 10/1997 | Rossi |
| 5,729,144 | A * | 3/1998 | Cummins ............ 324/535 |
| 6,477,475 | B1 | 11/2002 | Takaoka |
| 6,798,211 | B1 | 9/2004 | Rockwell |
| 7,174,261 | B2 | 2/2007 | Gunn |
| 7,535,233 | B2 | 5/2009 | Kojovic |
| 7,733,094 | B2 | 6/2010 | Bright |
| 8,525,522 | B2 * | 9/2013 | Gong et al. ............ 324/522 |
| 8,655,609 | B2 | 2/2014 | Schweitzer |
| 8,781,766 | B2 | 7/2014 | Schweitzer |
| 2002/0165462 | A1 | 11/2002 | Westbrook |
| 2004/0189317 | A1 * | 9/2004 | Borchert et al. ........ 324/512 |
| 2006/0012374 | A1 * | 1/2006 | Kojovic et al. ........ 324/522 |
| 2008/0077336 | A1 | 3/2008 | Fernandes |
| 2009/0230974 | A1 | 9/2009 | Kojovic |
| 2011/0173496 | A1 | 7/2011 | Hosek |
| 2011/0264388 | A1 | 10/2011 | Gong |
| 2012/0086459 | A1 | 4/2012 | Kim |
| 2013/0021039 | A1 | 1/2013 | Bjorklund |
| 2013/0096854 | A1 | 4/2013 | Schweitzer |
| 2013/0100564 | A1 | 4/2013 | Zhang |

FOREIGN PATENT DOCUMENTS

| | | |
|---|---|---|
| EP | 164711 | 12/1991 |
| EP | 244649 | 4/1992 |
| EP | 0627085 | 12/2005 |
| GB | 1463755 | 2/1977 |
| WO | 9519060 | 7/1995 |
| WO | 2010099585 | 9/2010 |

OTHER PUBLICATIONS

Masaoki Ando, Edmund O. Schweitzer III, R. A. Baker, Development and Field-Data Evaluation of Single-End Fault Locator for Two-Terminal HVDC Transmission Lines, IEEE Transactions on Power Apparatus and Systems, vol. PAS-104, No. 12, 1985.

Masaoki Ando, Fault Location Techniques for HVDC Lines: Analysis, Development, Simulation, and Field-Data Evaluation, 1984.

P.F. Gale, Overhead Line Fault Location Based on Travelling Waves & GPS, 1993.

Elhaffar, Power Transmission Line Fault Location Based on Current Traveling Waves. TKK Dissertations 107, Espoo 2008, Helsinki University of Technology. Department of Electrical Engineering, Dec. 2008.

Harry Lee, Development of an Accurate Transmission Line Fault Locator Using the Glabal Positioning System and Satellites, 1994.

Hewlett Packard, Traveling Wave Fault Location in Power Transmission Systems, Application Note 1285, 1997.

Michael A. Street, Delivery and Application of Precise Timing for a Traveling Wave Powerline Fault Locator System, 1990.

PCT/US2012/060089 Patent Cooperation Treaty, International Search Report and Written Opinion of the International Searching Authority, Feb. 5, 2013.

Sergio Luiz Zimath, Marco Antonio Ramos, Jayme Silva Filho, Joaquim Moutinho Beck, Nei Mueller, Traveling Wave-Based Fault Location Experiences, 2010.

Qualitrol Corporation, Telefault TWS Traveling Wave Fault Locator, Qualitrol Brochure 2004.

Reason International, Inc., Traveling Wave Fault Location in Power Transmission Systems, White Paper.

Carlos Alberto Dutra, Rafael Rosar Matos, Sergio Luiz Zimath, Jurandir Paz De Oliveira, Joao Henrique Monteiro De Resende, Joaquim Americo Pinto Moutinho, Fault Location by Traveling Waves: Application in High Impedance Events.

N. Fischer, V. Skendzic, R. Moxley, J. Needs, Protective Relay Traveling Wave Fault Location, Feb. 9, 2012.

PCT/US2014/055894 Patent Cooperation Treaty, International Search Report and Written Opinion of the International Searching Authority, Dec. 17, 2014.

PCT/US2014/055896 Patent Cooperation Treaty, International Search Report and Written Opinion of the International Searching Authority, Dec. 18, 2014.

PCT/US2014/055919 Patent Cooperation Treaty, International Search Report and Written Opinion of the International Searching Authority, Dec. 22, 2014.

Borghetti, et al, "On the use of continuous-wavelet transform for fault location in distribution power systems." International Journal of Electrical Power & Energy Systems. Nov. 2006.

\* cited by examiner

US 8,990,036 B1

POWER LINE PARAMETER ADJUSTMENT AND FAULT LOCATION USING TRAVELING WAVES

RELATED APPLICATIONS

This application claims benefit under 35 U.S.C. §119(e) of U.S. Provisional Application No. 61/878,524, filed 16 Sep. 2013, naming Edmund O. Schweitzer, Tony J. Lee, Armando Guzman-Casillas, Mangapathirao Venkata Mynam, David E. Whitehead, and Bogdan Z. Kasztenny as inventors, and titled "Fault Location Using Traveling Waves" which is hereby incorporated by reference herein in its entirety.

TECHNICAL FIELD

This disclosure relates to calculating a fault location on power lines based on traveling waves. More particularly, but not exclusively, this disclosure relates to techniques for calculating a fault location using a variety of techniques for analyzing data associated with traveling waves.

BRIEF DESCRIPTION OF THE DRAWINGS

Non-limiting and non-exhaustive embodiments of the disclosure are described, including various embodiments of the disclosure, with reference to the figures, in which.

DETAILED DESCRIPTION

Figure 1:
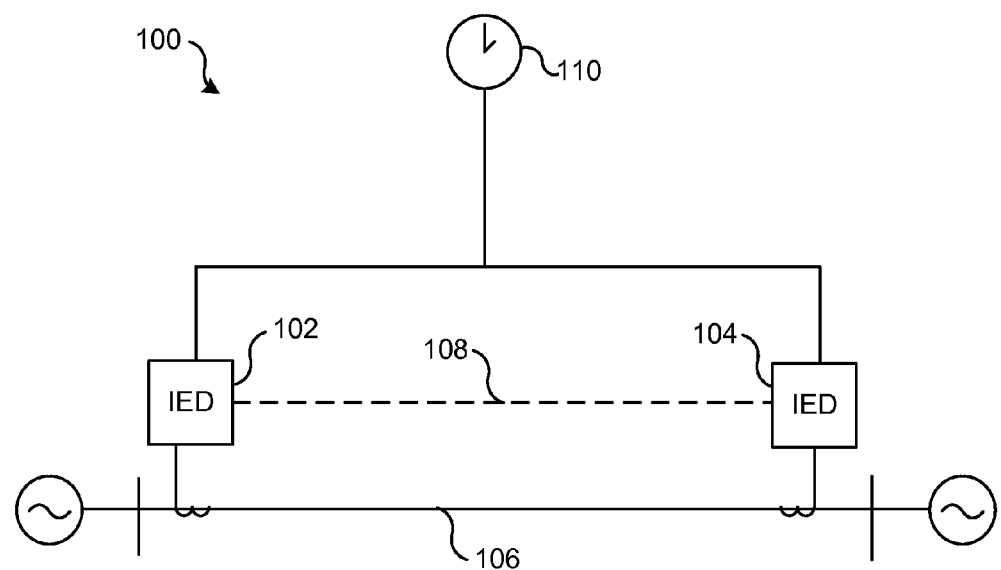
FIG. 1 illustrates a block diagram of a system for detecting a traveling wave and calculating a location of a fault using the detected traveling wave consistent with certain embodiments of the disclosure.

Traveling wave fault location (TWFL) systems are commercially available in dedicated fault location equipment or as an additional function included in certain digital fault recorders. Some electrical utilities in Canada and the USA use TWFL systems developed within the utility for internal use. The TWFL systems normally provide fault location information in a post-event fashion by analyzing current or voltage oscillograms—also known as event reports—from the fault. The fault location can be estimated using oscillograms from one terminal or all terminals of a transmission line. Multiple terminal TWFL systems use current or voltage samples with their corresponding time stamps according to the Coordinated Universal Time (UTC) time to simplify calculations. These systems obtain the events from transmission line terminals and use a general purpose computer that runs software to determine a location of the fault.

Today, most line protective relays provide fault location estimation in real time using impedance-based algorithms. These algorithms use local voltage and current information and/or current and voltage information from the remote terminals. When using information from both terminals, the accuracy of the impedance-based fault location estimation can be within 1.5%. This accuracy may be a function of the line length. In most applications this accuracy is sufficient to promptly locate faults in lines with lengths of 20 ml or less. This accuracy may not be satisfactory, however, for long lines (e.g., 150 ml length or longer) because even a small percentage error means a relatively long physical distance to be patrolled. Therefore, a utility may elect to use a dedicated TWFL system. The accuracy of a TWFL system is not necessarily a function of line length and is typically within ±0.2 ml. TWFL systems are also suitable for series compensated lines while impedance-based fault location algorithms may not be well suited for such applications. For the above reasons, there is a need in the industry for protective relays with built-in TWFL capability.

One of the limitations of TWFL systems is that when a pre-fault voltage at the fault location is zero, the fault may not generate traveling waves. In these circumstances, the impedance-based fault location method can still locate the fault. Accordingly, in order to gather data regarding a traveling wave, continuous monitoring may be employed. According to some embodiments, including a TWFL system may be incorporated into a protective relay that continuously monitors a transmission line. Another benefit that may be realized, according to some embodiments disclosed herein, is that the fault location is calculated when there is an internal line fault, thereby avoiding nuisance fault location alarms when faults do not exist on the monitored line. An additional benefit that may be realized is that the protective relay can be applied to terminals with double breakers and provide fault location information when one of the breakers is out of service. In addition to the above, the embodiments herein may calculate fault location in real time, or in a time-deterministic fashion. That is, embodiments herein may provide the calculated fault location in a time such that a protective action may be taken using the calculated fault location.

The embodiments of the disclosure will be best understood by reference to the drawings, wherein like parts are designated by like numerals throughout. It will be readily understood that the components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once, unless otherwise specified.

In some cases, well-known features, structures or operations are not shown or described in detail. Furthermore, the described features, structures, or operations may be combined in any suitable manner in one or more embodiments. It will also be readily understood that the components of the embodiments as generally described and illustrated in the figures herein could be arranged and designed in a wide variety of different configurations.

Several aspects of the embodiments described will be illustrated as software modules or components. As used herein, a software module or component may include any type of computer instruction or computer executable code located within a memory device and/or transmitted as electronic signals over a system bus or wired or wireless network. A software module or component may, for instance, comprise one or more physical or logical blocks of computer instructions, which may be organized as a routine, program, object, component, data structure, etc., that performs one or more tasks or implements particular abstract data types.

In certain embodiments, a particular software module or component may comprise disparate instructions stored in different locations of a memory device, which together implement the described functionality of the module. Indeed, a module or component may comprise a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules or components may be located in local and/or remote memory storage devices. In addition, data being tied or rendered together in a database record may be resident in the same memory device, or across several memory devices, and may be linked together in fields of a record in a database across a network.

Embodiments may be provided as a computer program product including a non-transitory computer and/or machine-readable medium having stored thereon instructions that may be used to program a computer (or other electronic device) to perform processes described herein. For example, a non-transitory computer-readable medium may store instructions that, when executed by a processor of a computer system, cause the processor to perform certain methods disclosed herein. The non-transitory computer-readable medium may include, but is not limited to, hard drives, floppy diskettes, optical disks, CD-ROMs, DVD-ROMs, ROMs, RAMs, EPROMs, EEPROMs, magnetic or optical cards, solid-state memory devices, or other types of media/machine-readable medium suitable for storing electronic and/or processor executable instructions.

FIG. 1 illustrates a block diagram of a system 100 for detecting a traveling wave and calculating a location of a fault using the detected traveling wave consistent with certain embodiments of the disclosure. System 100 may include generation, transmission, distribution and/or similar systems. System 100 includes a conductor 106 such as a transmission line connecting two nodes. Although illustrated in single-line form for purposes of simplicity, system 100 may be a multi-phase system, such as a three-phase electric power delivery system. System 100 is monitored by IEDs 102 and 104 at two locations of the system, although further IEDs may also be utilized to monitor further locations of the system.

IEDs 102 and 104 may obtain electric power system information using current transformers (CTs), potential transformers (PTs), Rogowski coils, and/or the like. IEDs 102 and 104 may receive common time information from a common time source 110. According to one embodiment, IEDs 102 and 104 may be embodied as line current differential relays (e.g., Model No. SEL-411L available from Schweitzer Engineering Laboratories (SEL) of Pullman, Wash.).

Common time source 110 may be any time source capable of delivering a common time signal to each of IEDs 102 and 104. Some examples of a common time source include a Global Navigational Satellite System (GNSS) such as the Global Positioning System (GPS) system delivering a time signal corresponding with IRIG, a WWVB or WWV system, a network-based system such as corresponding with IEEE 1588 precision time protocol, and/or the like. According to one embodiment, common time source 110 may comprise a satellite-synchronized clock (e.g., Model No. SEL-2407, available from SEL). Further, it should be noted that each IED 102, 104 may be in communication with a separate clock, such as a satellite-synchronized clock, with each clock providing each IED 102, 104 with a common time signal. The common time signal may be derived from a GNSS system or other time signal.

A data communication channel 108 may allow IEDs 102 and 104 to exchange information relating to, among other things, traveling waves. According to some embodiments, a time signal based on common time source 110 may be distributed to and/or between IEDs 102 and 104 using data communication channel 108. Data communication channel 108 may be embodied in a variety of media and may utilize a variety of communication protocols. For example, data communication channel 108 may be embodied utilizing physical media, such as coaxial cable, twisted pair, fiber optic, etc. Further, data communication channel 108 may utilize communication protocols such as Ethernet, SONET, SDH, or the like, in order to communicate data. According to one specific embodiment, communication channel 108 may be embodied as a 64 kbps bidirectional communication channel. In further embodiments, data communication channel 108 may be a wireless communication channel (e.g., a radio communication channel) utilizing any suitable wireless communication protocol.

Two-end fault locating methods, which may be referred to herein as Type D methods, may use a time difference between the first (front) traveling waves captured at both terminals along with the line length and wave propagation velocity to compute the fault location. Measurement devices at the line terminals detect the traveling waves and time stamp the arrival of the wave using a common time reference (e.g., IRIG-B or IEEE 1588). In certain embodiments, a distance to a fault location (m) is calculated using Eq. 1.

$$m = \frac{1}{2}[L + (t_L - t_R) \cdot v] \qquad \text{Eq. 1}$$

where:
 $t_L$ is the front wave arrival time at the L Terminal,
 $t_R$ is the front wave arrival time at the R Terminal,
 v is the wave propagation speed,
 L is the line length.

Traditionally these solutions use a master station that accesses the wave arrival times and estimates the fault location. Recently, line relays equipped with traveling wave fault locating function may exchange the wave arrival times, calculate the fault location, and make the fault location available at the relay. One of the key benefits of using the Type D method is its simplicity and immunity to reflections.

Figure 2A:
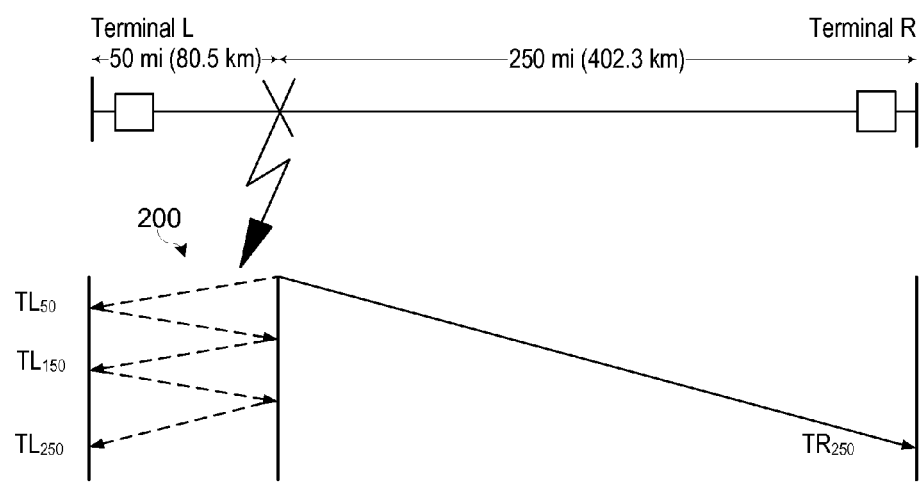
FIG. 2A illustrates a lattice diagram showing traveling waves over a relative time scale created by a fault event on a 300 mile (482.8 km) long transmission line consistent with embodiments of the disclosure.

FIG. 2A illustrates a lattice diagram 200 showing traveling waves created by a fault consistent with certain embodiments of the disclosure. In the illustrated embodiment, a fault is located 50 miles (80.5 km) from a first terminal on a 300 mile (482.8 km) long line. The initial wave triggered by the fault reaches the terminal L at time $TL_{50}$, and reaches the terminal R at time $TR_{250}$. The Type D method may use the $TL_{50}$ and $TR_{250}$ to compute the fault location while ignoring all the other waves. When desired, remaining wave arrivals can be used to improve the initial fault location result.

Figure 2B:
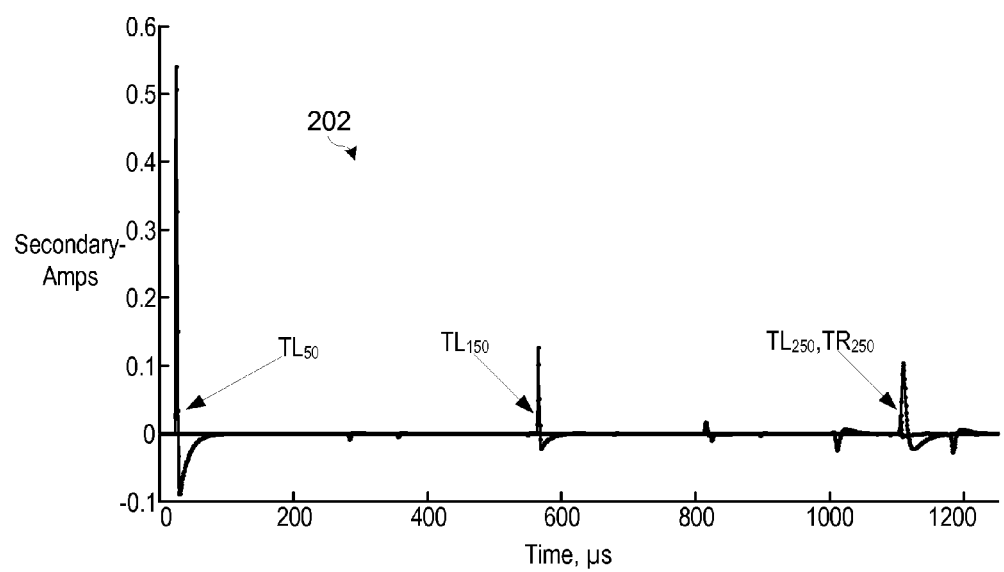
FIG. 2B illustrates the traveling waves as a function of current over time from the fault illustrated in FIG. 2A consistent with embodiments of the present disclosure.

FIG. 2B illustrates the current traveling waves over time 202 for the fault illustrated in FIG. 2A. As illustrated, the amplitude of the subsequent traveling waves diminishes with each reflection. Time alignment of data samples received at both Terminal L and Terminal R allows for comparison of the travelling waves from both terminals.

A single-end fault locating method, which is also referred to herein as a Type A fault locating method, uses the time difference between the first arrived traveling wave and a subsequent reflection from the fault or the remote terminal. The Type A method is not dependent on a communication channel to the remote terminal. However, the challenge is to identify and select the appropriate reflection. The Type A method may be useful, according to some embodiments, when the fault location is computed during reclosing events on a permanent fault when one of the terminals is open.

FIG. 2B illustrates the reflections from the fault at Terminal L. The polarity, amplitude, and arrival time of the subsequent waves can be used to identify the wave reflected from the fault or from the remote terminal and calculate the fault location. At the L Terminal, the Type A method may use points labeled $TL_{50}$ and $TL_{150}$ in FIG. 2B to compute the fault location while ignoring other waves and reflections. In certain embodiments, a distance to a fault location (m) may be calculated using the Type A method using Equation 2.

$$m = \left(\frac{t_{L2} - t_{L1}}{2}\right) \cdot v \qquad \text{Eq. 2}$$

where:
 $t_{L2}$ is the arrival time of the first reflection from the fault at the L Terminal;
 $t_{L1}$ is the arrival time of the initial wave front from the fault at the L Terminal; and
 v is the wave propagation speed.

Certain embodiments may further utilize an impedance-based method to provide an estimate of a fault location. The term "impedance-based fault location" refers to any method that uses phasors of voltages, currents, and line impedance to determine a fault location. Certain embodiments may utilize band pass filtered signals with the useful bandwidth near the power system fundamental frequency.

The estimate of the fault location based on the impedance-based method may be used to establish validation criteria for reflections and/or measurements used by a fault location system. One-ended impedance-based fault locators calculate the fault location from the apparent impedance seen by looking into the line from one end. If the positive and zero-sequence source impedances, $Z_0$ and $Z_1$, are known, a location of a fault may be estimated and further improved. The estimated location of the fault may be termed an "initial" location of the fault, as this initial estimate may be used in further calculations to more accurately determine a location of the fault. Such further calculations may be iterative in nature. Impedance estimation systems using local and remote measurements may be accurate to within few percent of the line length (e.g., approximately 0.5% to 2%). Using an estimate of the fault location from the impedance-based method, an approximate spacing of the waves reflected from the fault and the remote line terminal may be determined.

Figure 2C:
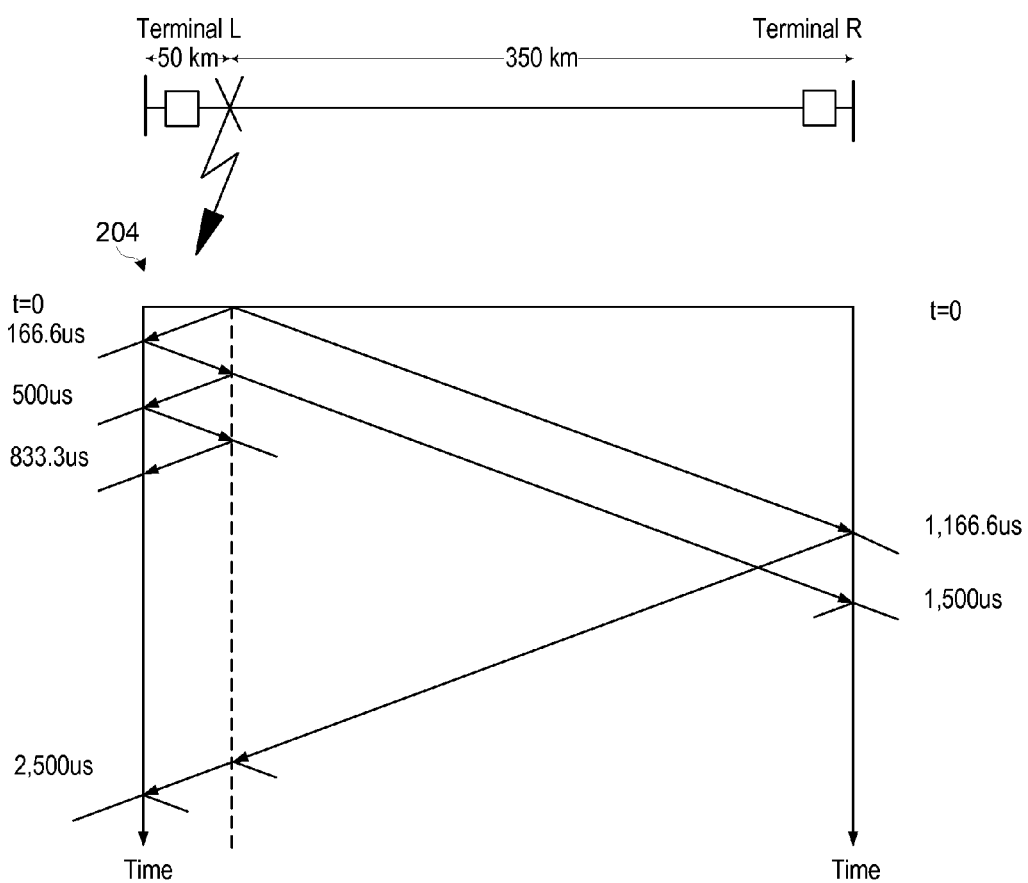
FIG. 2C illustrates a lattice diagram showing the traveling waves at a remote terminal and a local terminal from a fault event on a 400 km long transmission line consistent with embodiments of the present disclosure.

FIG. 2C illustrates a lattice diagram 204 showing the traveling waves at a remote terminal and a local terminal from a fault event on a 400 km long transmission line consistent with embodiments of the present disclosure. Assuming a $3 \times 10^8$ m/s propagation velocity, a fault located by the impedance-based algorithm at 50 km on a 400 km line would result in a time lag between the initial front-wave and the first legitimate reflection from the fault that may be calculated using Eq. 3.

$$\frac{2 \times 50 \times 10^3}{3 \times 10^8} = 333 \text{ }\mu s \qquad \text{Eq. 3}$$

Further, knowing that the line is 400 km long, it is possible to obtain a delay time estimate for the first wave reflected from the remote terminal. With respect to the instant of fault occurrence, the first reflection from the remote terminal will be per Eq. 4.

$$\frac{(2*400-50)*10^3}{3*10^8} = 2,500 \text{ }\mu s \qquad \text{Eq. 4}$$

As illustrated in FIG. 2C, a local relay generates measurement with respect to the first arriving wave, which is 166.6 is less because of the 50 km distance. The estimate determined using Eq. 4 may provide a window in which a wave reflected may be expected after the initial front wave. This estimate can be further used to validate the coherence between the impedance-based results and the positions of the key reflections recorded by the TWFL device. Moreover, assuming a 3% error in the impedance-based fault locator, the expected fault location is 50±0.03*400, thus the fault estimate is between 38 km and 62 km. Applying the 3% error range to the expected time between the arrival of the initial wave and the first reflection from the fault yields a window between 253 microseconds and 413 microseconds, based on the expected value of 333 microseconds. Also, we may further refine that the wave reflected from the remote terminal should arrive between 2,460 and 2,540 microseconds, with the expected value of 2,500 microseconds after the fault occurrence. Using the impedance-based method, a fault location system may establish time windows for legitimate reflections from the fault and the other line terminal. Thus, the time windows may be validation criteria established based on the impedance-based method. The second reflection from the fault should arrive after another 333 microseconds after the first reflection (i.e., 833.3−166.6=666 microseconds after the initial wave arrival in the present example).

Determining one or more windows in which travelling waves are expected may allow a fault location system to reject reflections from the adjacent buses and other discontinuities and apply the single-end method, as set forth in Eq. 2. If the time windows established using the impedance-based fault location do not contain waves of considerable amplitude and coherent polarity, embodiments consistent with the present disclosure may refrain from using the single-end approach and will not report fault location with a potentially large error. Such embodiments may suggest that an operator use other techniques to locate the fault rather than investing resources following the incorrect indication from the TWFL device. In addition the time windows established with the use of the impedance-based fault location methods can be adjusted for the effect of dispersion and noise in the measurements as discussed below.

If the windows contain multiple reflections, additional TWFL estimate refinement can be obtained by using numeric optimization techniques (e.g., the least squares optimization algorithms) may be used to maximize (or minimize) a desired goal function. One such function (applicable to each of the two ends) may for example be the best matching travel time to fault ($t_f$) with a known line length and line travel time ($t_L$), which may be expressed using Equation 5.

$$\max(x(t)^2 + x(t+2 \times t_f)^2 + x(t+4 \times t_f)^2 + x(t+t_L-2\times t_f+t_L)^2) \qquad \text{Eq.5}$$

Similar optimizations may be performed searching for $t_f$ and $t_L$ (2 parameter search) with impedance-based result and nominal line length used as starting points for the search. Search sample instant x(t) can be selected as the arrival instant of the first peak, or sum of squares of a finite number of samples around that peak. For example, t could span all data points from 10 μs before the first peak to 50 μs after the peak. A number of points used can be selected to match the known impulse response of a device acquiring traveling wave fault location data. When sub-sample resolution is desired, interpolation methods may be used to estimate more finely positioned sample values.

Correlation methods may further be used to enhance the optimization algorithm search. Additional optimization parameters (beyond the described 2; $t_f$ and $t_L$) and an arbitrary number of expected reflection points (beyond the 3 reflection arrivals) may also be used. Such optimizations and correlations may be performed independently on each of the two terminals; or jointly in a central location with access to data from both terminals. Nonlinear optimization methods can similarly be used to improve precision of the single-end traveling wave fault location systems. Dispersion compensation (described further down) can also be used to further improve the nonlinear optimization results.

Fault location systems utilizing information from two terminals may provide a robust method, such may not need to rely on analysis of multiple wave reflections that are present at any given line terminal. Fault location systems using information from two terminals may use time stamps generated by IEDs at each line terminal. The IEDs may generate the signal time using a common and precise time reference, such as the time signal provided by the GPS or by a terrestrial system such as the Integrated Communications Optical Network (ICON®) device, available from Schweitzer Engineering Laboratories of Pullman, Wash.

Fault location systems using information from two or more terminals may be benefited by, among other things: (1) communicating reliably and (2) accurately time stamping measurements received at different locations. In certain circumstances, precise timing may not be available due to problems with the GPS clocks and antennas, poor weather conditions, GPS spoofing or jamming. Communications channels may be lost due to problems with fiber cables or communications devices, or any other network outage such as out of service condition for maintenance. Inability to use precise time at either of the line terminals or inability to communicate may render the double-end method unusable. At the same time each of the TWFL devices monitors availability and quality of both timing and communications. Upon detecting a problem in either of the two enabling technologies, fault detection systems consistent with the present disclosure may be able to fallback into a single-end TWFL method (i.e., using Equation 2 in place of Equation 1).

The single-end TWFL method has its own challenges, that may be caused by resolving the multiple reflections as described earlier (see FIG. 1), but it does not necessarily require absolute timing among a plurality of TWFL devices or communications among the plurality of TWFL devices. The internal clock of the TWFL device may be precise enough to provide correct timing information between the reflections at the line terminal. These times may not have to be referenced to any common time base, so the single-end method may function irrespective of any external time signals. The single-end method can be supported by the impedance-based method to aid in resolving the issue of multiple reflections without using measurements from a remote terminal.

Figure 3A:
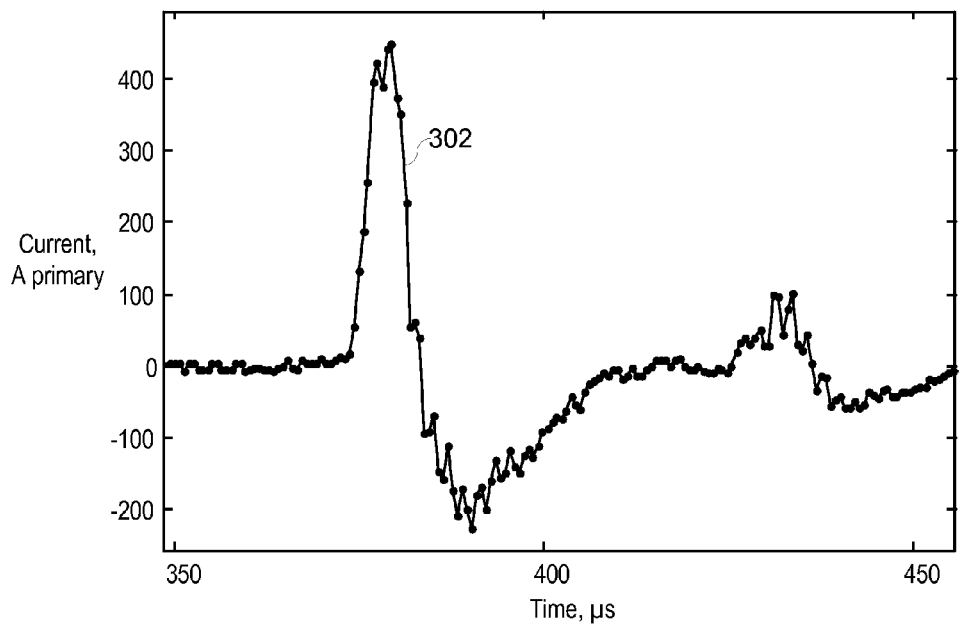
FIG. 3A illustrates a traveling wave captured at a line terminal during an internal fault event consistent with certain embodiments of the disclosure.
Figure 3B:
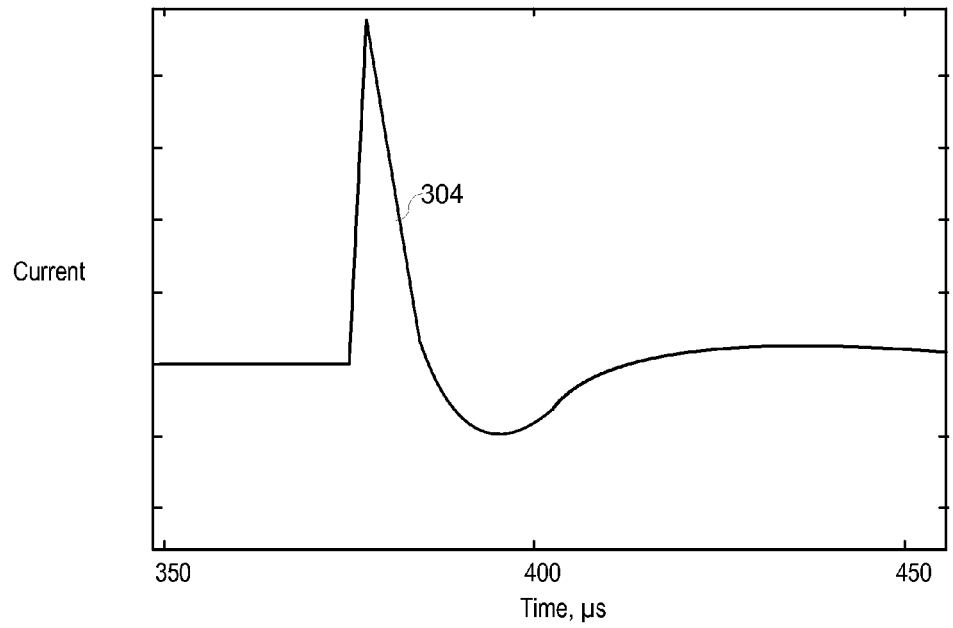
FIG. 3B illustrates a step response of an analog filter used to capture the waveform of FIG. 3A.

FIG. 3A illustrates a traveling wave 302 captured at a line terminal during an internal fault event consistent with certain embodiments of the disclosure. FIG. 3B illustrates a step response 304 of an analog filter used to capture the waveform of FIG. 3A. Comparing FIG. 3A and FIG. 3B, the actual faults generate signals with significant distortion, which may increase the difficulty of the time stamping operation. Dispersion of the wave as it travels along the line (linear ramp rather than a step), shield wire strike events, reflections from line discontinuities, ringing in the secondary wiring, backflash events and ringing in the ground wire circuit of the transmission line are some of the sources of distortion. According to certain embodiments, using the band-pass analog filter may yield a waveform such as the waveform shown in FIG. 3B, which may be analyzed to determine the arrival of the secondary current wave.

A threshold may be used to measure the arrival time of the traveling wave illustrated in FIG. 3B; however, detecting the arrival time of the travelling wave illustrated in FIG. 3A may be more complicated, since a threshold may make the detection time dependent on the wave amplitude. A system that detects a traveling wave based on a threshold may introduce a certain errors, which may exceed several microseconds, as illustrated by the waveform in FIG. 3A, even if interpolation between samples were used.

Figure 4:
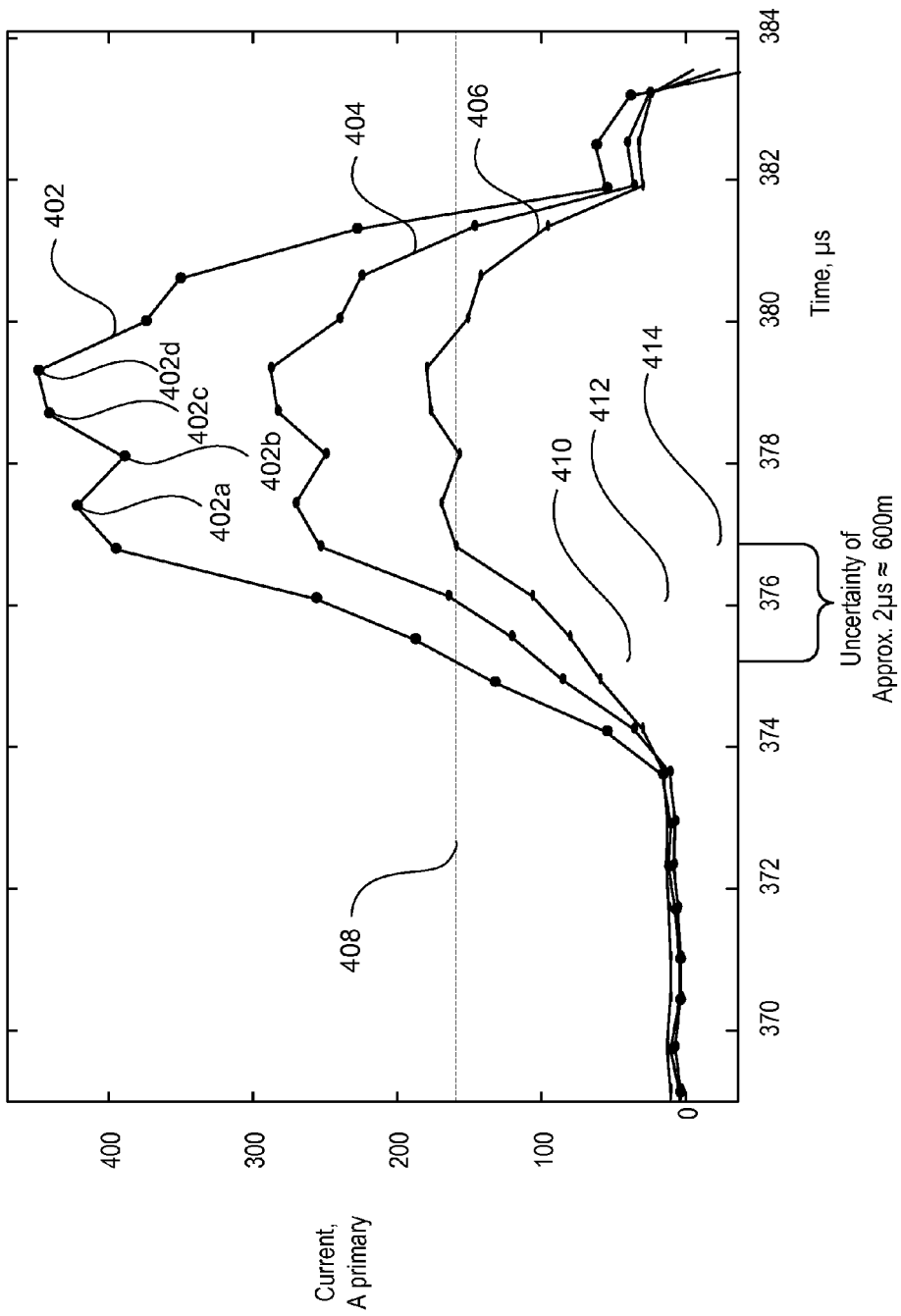
FIG. 4 illustrates three waveforms and a threshold that may be used to determine a fault event consistent with certain embodiments of the disclosure.

FIG. 4 illustrates three waveforms 402, 404, and 406 and a threshold 408 that may be used to determine a fault event consistent with certain embodiments of the disclosure. As illustrated in FIG. 4, the wave amplitude in relation to the threshold 408 may impact a time measurement associated with detection of the fault. In attempting to identify the arrival time of a traveling wave, a time stamp may be assigned to a feature of the wave such as, for example, either the beginning of the wave or to the peak of the wave.

As illustrated in FIG. 4, the peak of a measured waveform may not necessarily be well defined. Multiple maxima, either absolute or local maxima, may be present in a measured signal. Variations in a signal (i.e., noise) may obscure or exaggerate the peak, especially in conjunction with other issues, such as ringing in the secondary wires, ringing in the ground wires, or fast reflections from closely located discontinuities in the primary system.

Measurements 402a-402d illustrate some of the difficulties associated with identifying a peak, measurements 402a and 402d are local maxima, measurement 402d is the highest value, and measurement 402c represents the approximate temporal midpoint of the peak of waveform 402. For these reasons, any one of these measurements may be considered the peak of waveform 402. There are also, however, reasons for rejecting the identified measurements as the peak of waveform 402. For example, a system that merely identifies a maximum value (e.g., measurement 402d) may cause a large round-up error. A system that identifies a peak by identifying a rising series of measurements followed by a decrease (e.g., measurements 402A and 402d) may be undesirable because such a system may incorrectly identify two peaks associated with waveform 402. Certain embodiments may apply filtering, curve-fitting and interpolation to ameliorate these issues, but the problem of an ill-defined peak may inhibit successful implementation of such techniques.

In addition to or in lieu of identifying peak value, certain embodiments may seek to identify a time that a traveling wave arrives. FIG. 4 illustrates a threshold 408 that may be used to determine the arrival of a traveling wave. As illustrated, each of waveforms 402, 404, and 406 have a different slope. As a result, waveforms 402, 404, and 406 reach threshold 408 at different times. The time at which waveforms 402, 404, and 406 reaches threshold 408 are shown by lines 410, 412, and 414, respectively. The time between waveform 402 for reaching threshold 408 and waveform 406 reaching threshold 408 is approximately 2 µs. In 2 µs, a traveling wave may travel approximately 600 m. Accordingly, a fault location identified by a fault location system could be off by as much as 600 m.

Figure 5:
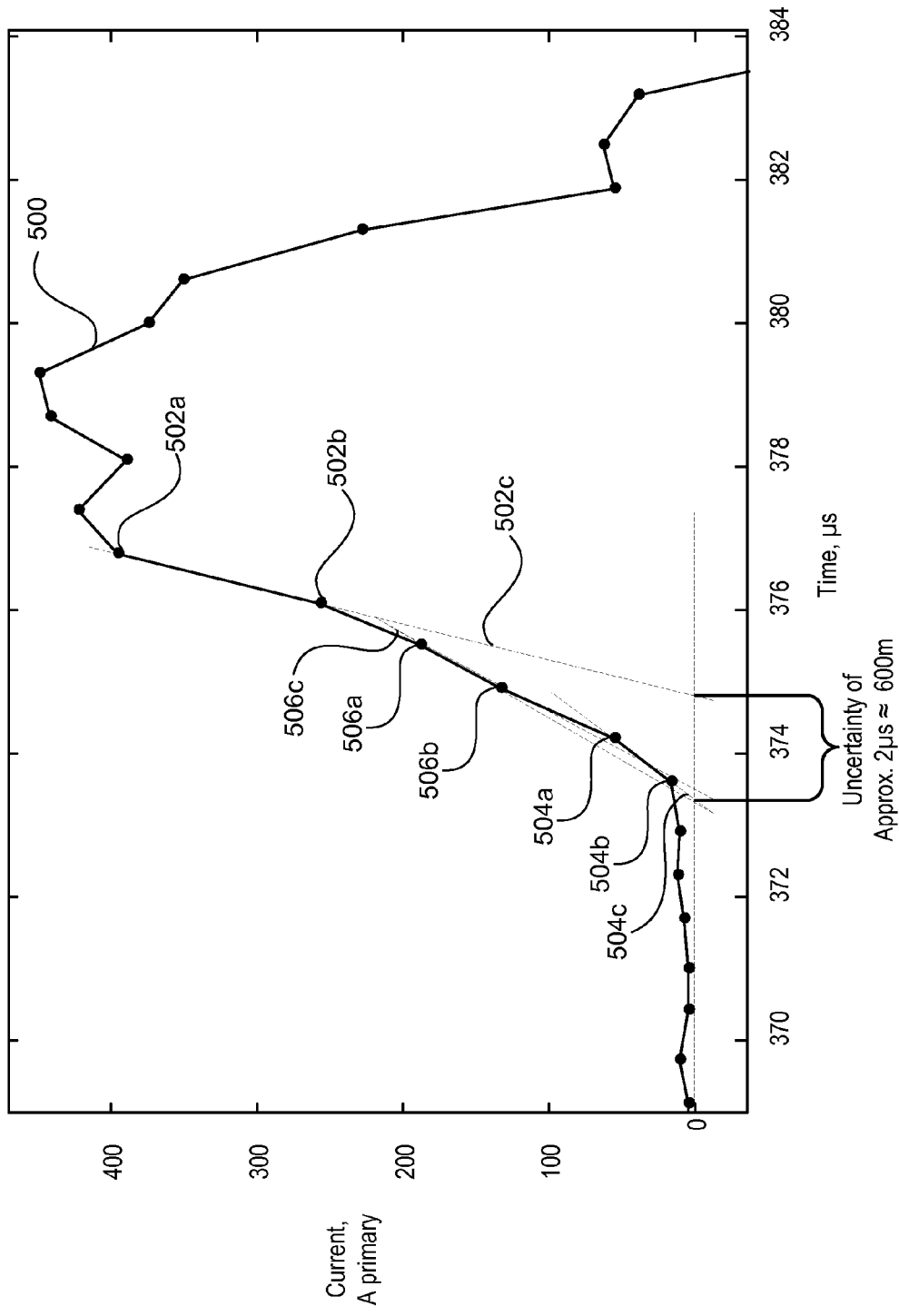
FIG. 5 illustrates a waveform that shows certain difficulties associated with determining the arrival time of a traveling wave by fitting a line to the rising edge of waveform and calculating the intercept with the time axis.

FIG. 5 illustrates a waveform 500 that shows certain difficulties associated with determining the arrival time of a traveling wave by fitting a line to the rising edge of waveform 500 and calculating the intercept with the time axis. This approach can also be described as calculating the time the signal is above a certain threshold and correcting it with an estimate of the time since the signal departed from zero and reached the applied threshold.

Depending on the portion of the rising edge that is used for extrapolating the ramp rate (steepness), different values of the time stamp may be given. As illustrated in FIG. 5, a plurality of lines 502c, 504c, 506c may be fitted to the rising edge of the waveform 500. Line 502c is based on the slope of a line between measurements 502A and 502b. Line 502c yields the latest intercept with the time axis. Line 504c is based on the slope of a line between measurements 504a and 504b. Line 506c yields the earliest intercept the time axis. Line 506c is based on the slope of a line between measurements 506a and 506b.

As shown in FIG. 5, the time difference between line 504c and line 506c is approximately 2 µs. As discussed above, and uncertainty of 2 µs may result in an uncertainty in a fault location of approximately 600 m. Accordingly, in order to definitively locate a fault, manual inspection of approximately 600 m of a transmission line may be involved.

Figure 6:
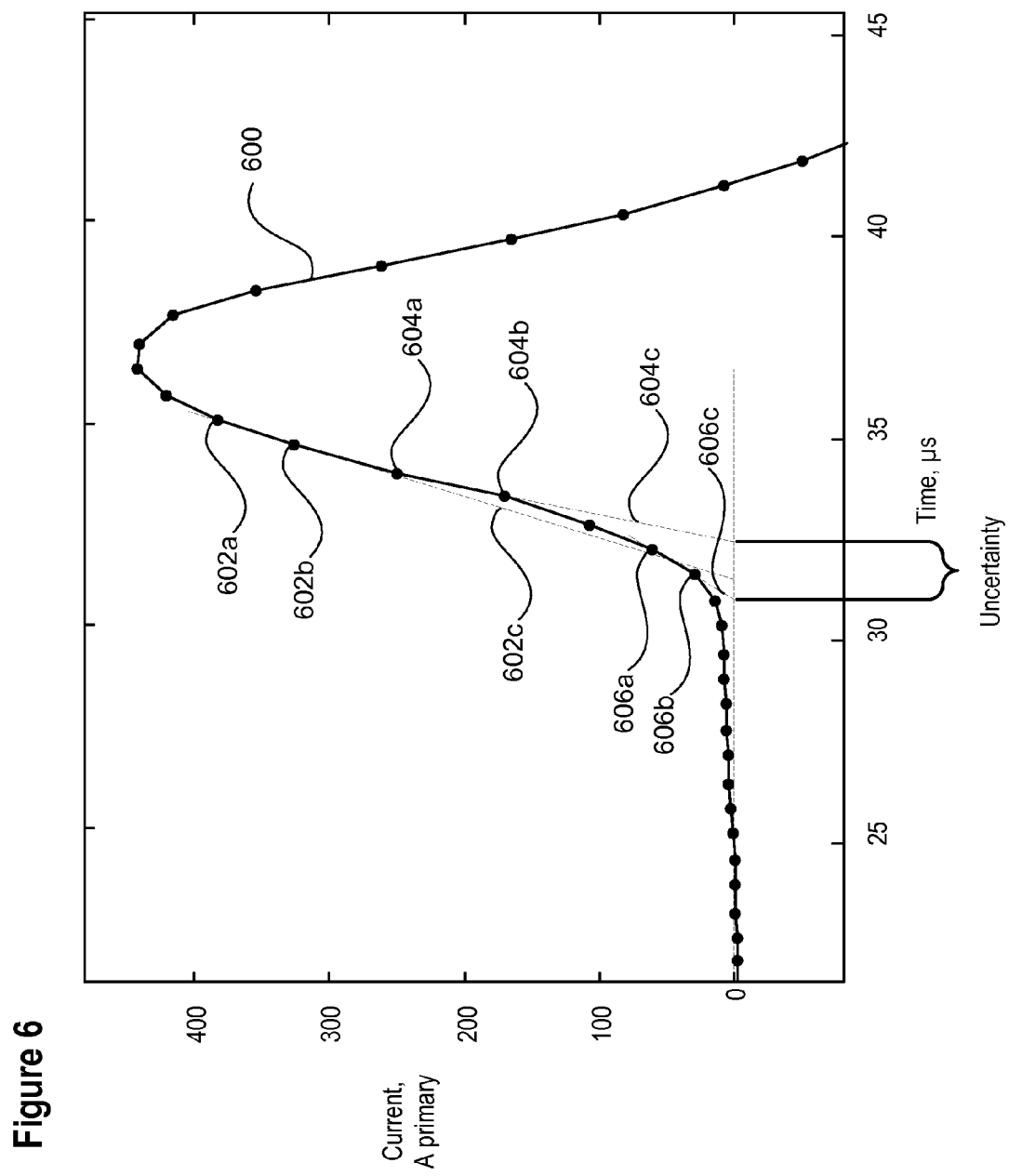
FIG. 6 illustrates the output of a low pass filter applied to a waveform showing a peak in a current consistent with certain embodiments of the disclosure.

FIG. 6 illustrates the output of a low pass filter 600 applied to a waveform 500 showing a peak in a current consistent with certain embodiments of the disclosure. As illustrated in FIG. 6, a plurality of lines 602c, 604c, and 606c may be fitted to the rising edge of the waveform. Line 602c is based on the slope of a line between measurements 602a and 602b, line 604c is based on the slope of a line between measurements 604a and 604b, and line 606c is based on the slope of a line between measurements 606a and 606b. Applying the low-pass filtering to remove distortions from the waveform may not solve the issue described in connection with FIG. 5 relating to estimating the arrival by fitting a line to the rising edge of waveform 600 and calculating the intercept with the time axis; however, a low pass filter approach, particularly when used in conjunction with other techniques described herein, may reduce the impact of high-frequency oscillations while preserving useful information associated with traveling waves.

Figures 7A, 7B, 7C, 7D:
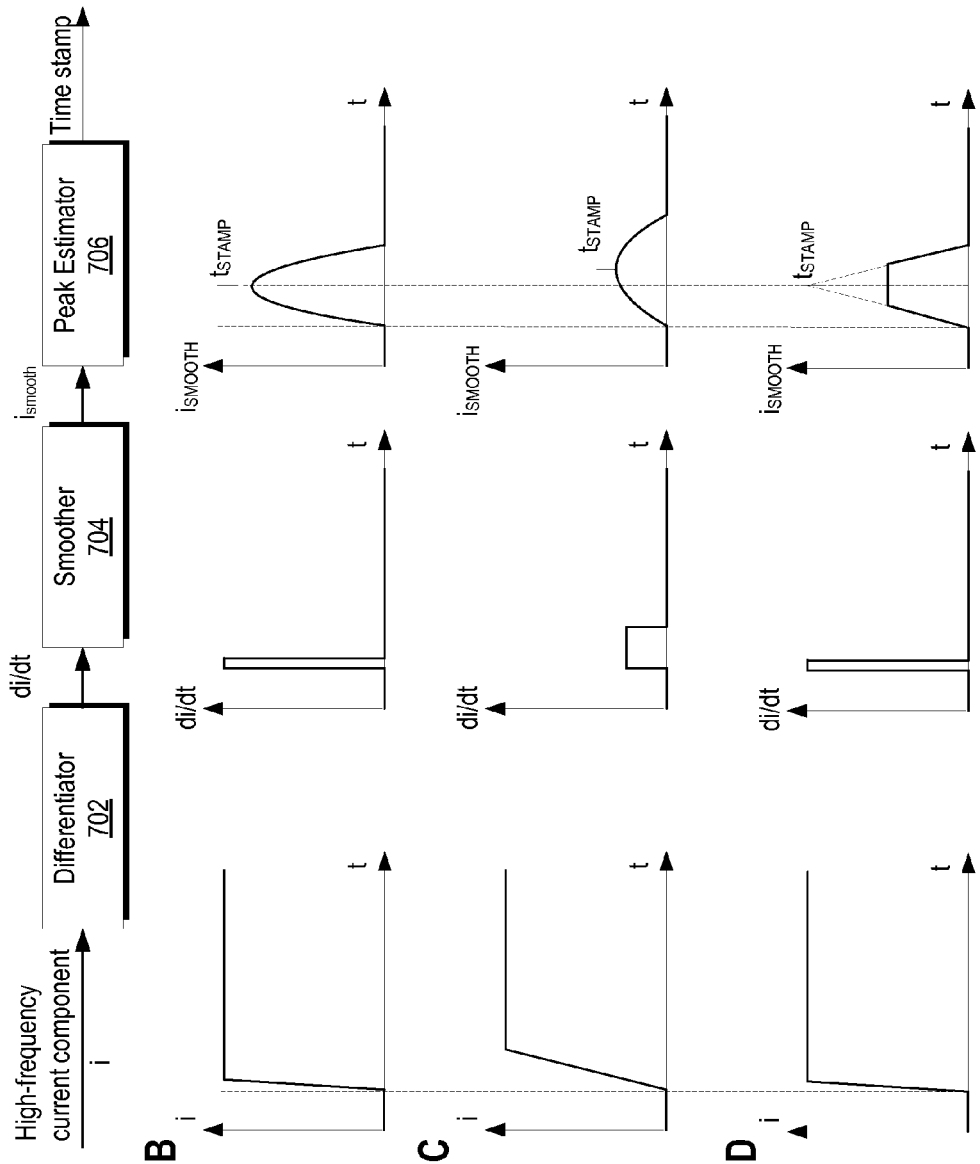
FIG. 7A illustrates a functional block diagram of a peak estimation system implementing a differentiator-smoother approach consistent with certain embodiments of the present disclosure.
FIG. 7B illustrates a scenario in which a fault is associated with a rise in a current flow that stabilizes, together with the resulting outputs of the components of the block diagram shown in FIG. 7A.
FIG. 7C illustrates a scenario in which a fault causes a slower rise in a current flow in comparison to the scenario illustrated in FIG. 7B, together with the resulting outputs of the components of the block diagram shown in FIG. 7A.
FIG. 7D illustrates a scenario in which a fault is associated with a rise in a current flow that stabilizes, together with the resulting outputs of the components of the block diagram shown in FIG. 7A.

FIG. 7A illustrates a functional block diagram of a peak estimation system implementing a differentiator-smoother method consistent with various embodiments of the present disclosure. As illustrated, a high-frequency current component is an input to a differentiator 702. According to some embodiments, the differentiator 702 may have a short time constant. In one particular embodiment, the time constant may be two consecutive samples, while in other embodiments, the time constant may be longer. The output of the differentiator 702 may be an input to a smoother 704. The smoother 704 may be embodied as a digital low-pass filter. In some embodiments, the smoother 704 may be embodied as a finite impulse response (FIR) filter. The output from the smoother 704 is provided as an input to a peak estimator 706, which may identify and time-stamp a peak value of the smoothed current signal.

FIG. 7B illustrates a scenario in which a fault is associated with a rise in a current flow that stabilizes, together with the resulting outputs of the components of the block diagram shown in FIG. 7A. The output of the differentiator shows a change in the current over a short duration. The output of the smoother 704 is a parabolic shape, the peak of which is identified with the designation $t_{stamp}$.

FIG. 7C illustrates a scenario in which a fault causes a slower rise in a current flow in comparison to the scenario illustrated in FIG. 7B, together with the resulting outputs of the components of the block diagram shown in FIG. 7A. As illustrated, the output of the differentiator in FIG. 7C is lower in comparison to the output of the differentiator in FIG. 7B because the rate of change of the current is lower. The output of the smoother is a parabolic shape, and again, the peak of which is identified with the designation $t_{stamp}$. As may be observed in comparing the output of the smoother in FIG. 7B and FIG. 7C, the peak is delayed in FIG. 7C because of the slower rate of change of the incoming waveform.

FIG. 7D illustrates a scenario in which a fault is associated with a rise in a current flow that stabilizes, together with the resulting outputs of the components of the block diagram shown in FIG. 7A. In FIG. 7D, the smoother may be embodied as an average of the window length longer than the wave ramp time. The output of the smoother is trapezoidal and is centered about the same time designated $t_{stamp}$ in FIG. 7B.

FIGS. 7B-7D illustrate that the peak estimation system using a differentiator-smoother approach shown in FIG. 7A tracks the mid-point of the rising edge of the waveform. As illustrated, the time stamp associated with the peak value is not affected by the amplitude of the signal. In contrast, and as discussed in connection with FIG. 4, a fault detection system using a threshold may be affected by the amplitude of the signal. Although the slope of the edge ramp may impact the calculated time stamp (as may be noted by comparing the peak of the smoother output in FIG. 7B to the delayed peak of the smoother output in FIG. 7C), this issue may be ameliorated using dispersion compensation, as disclosed herein.

Figure 8:
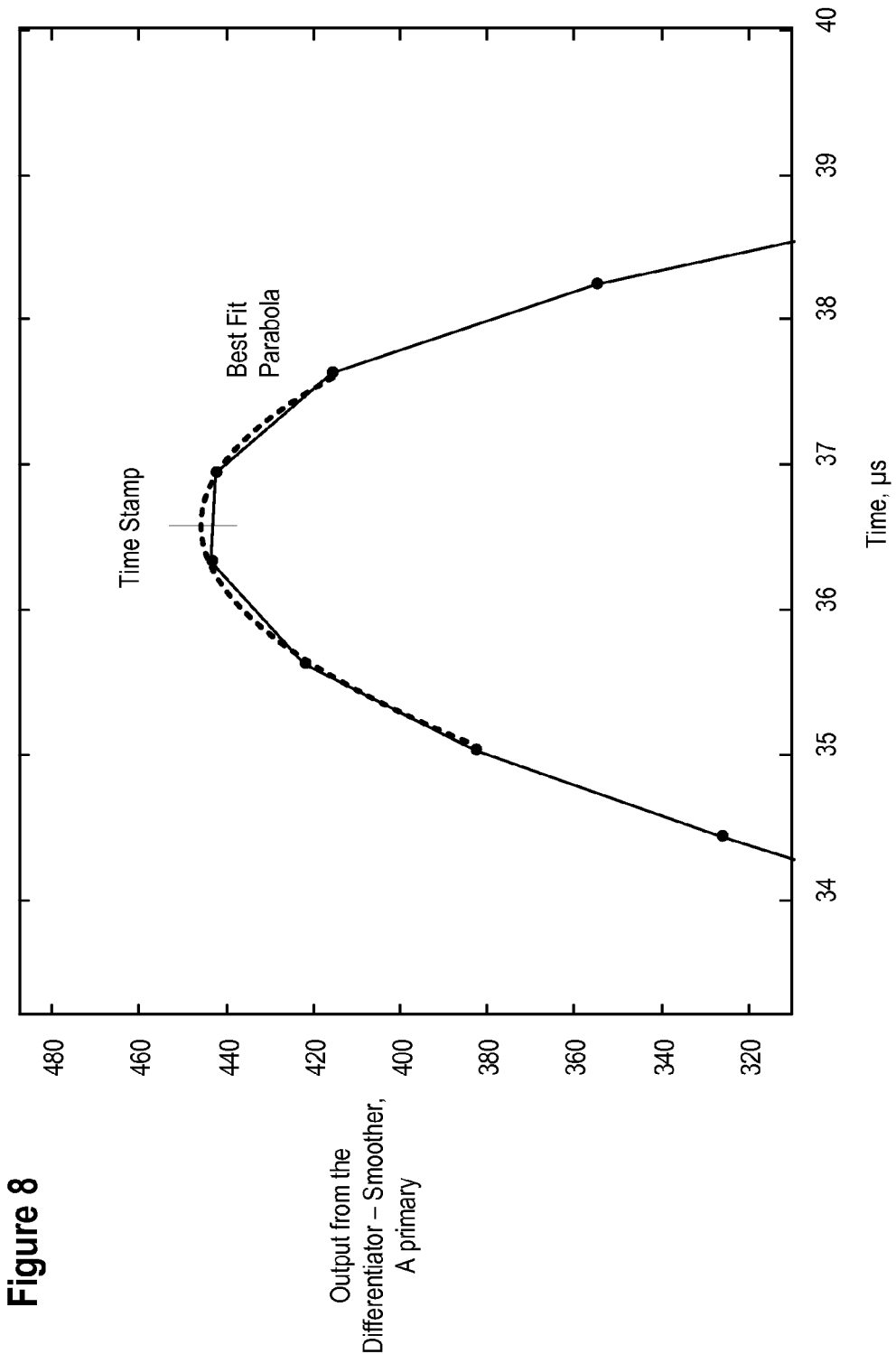
FIG. 8 illustrates a parabola fitted to the output of a peak estimation system using a differentiator-smoother consistent with certain embodiments of the present disclosure.

FIG. 8 illustrates a curve (which, in certain embodiments, may be a parabola) fitted to the output of a peak estimation system using a differentiator-smoother consistent with embodiments of the present disclosure. As noted in connection with FIG. 7B and FIG. 7C, the output of a fault location system incorporating a differentiator-smoother may be parabolic. Accordingly, certain embodiments may fit a parabola to the output for calculating the time of the smoother output maximum. A few samples may be selected prior to the peak sample and following the peak (e.g., two samples on each side of the maximum value, for example). A least error squared (LES) method may be used to fit a parabola to the selected points including the maximum sample. A peak may then be calculated from the analytical equation of the best-fit parabola. According to some embodiments, a parabolic fit may identify a waveform peak to an accuracy better than ⅕th of the sampling period.

The present disclosure is not limited to parabolic functions or to any specific number of samples to be fit before or after the peak. Moreover, the present disclosure is not limited to any form of differentiating or any form of smoothing. Sample differentiators can use 2, 3, 4 or more samples and various data windows such as [1, −1], [1, 0, −1], [0.5, 1, 0.5, 0, −0.5, −1, −0.5], etc. Sample smoothers can use averaging methods, or filters both of the finite or infinite impulse response.

Figure 9:
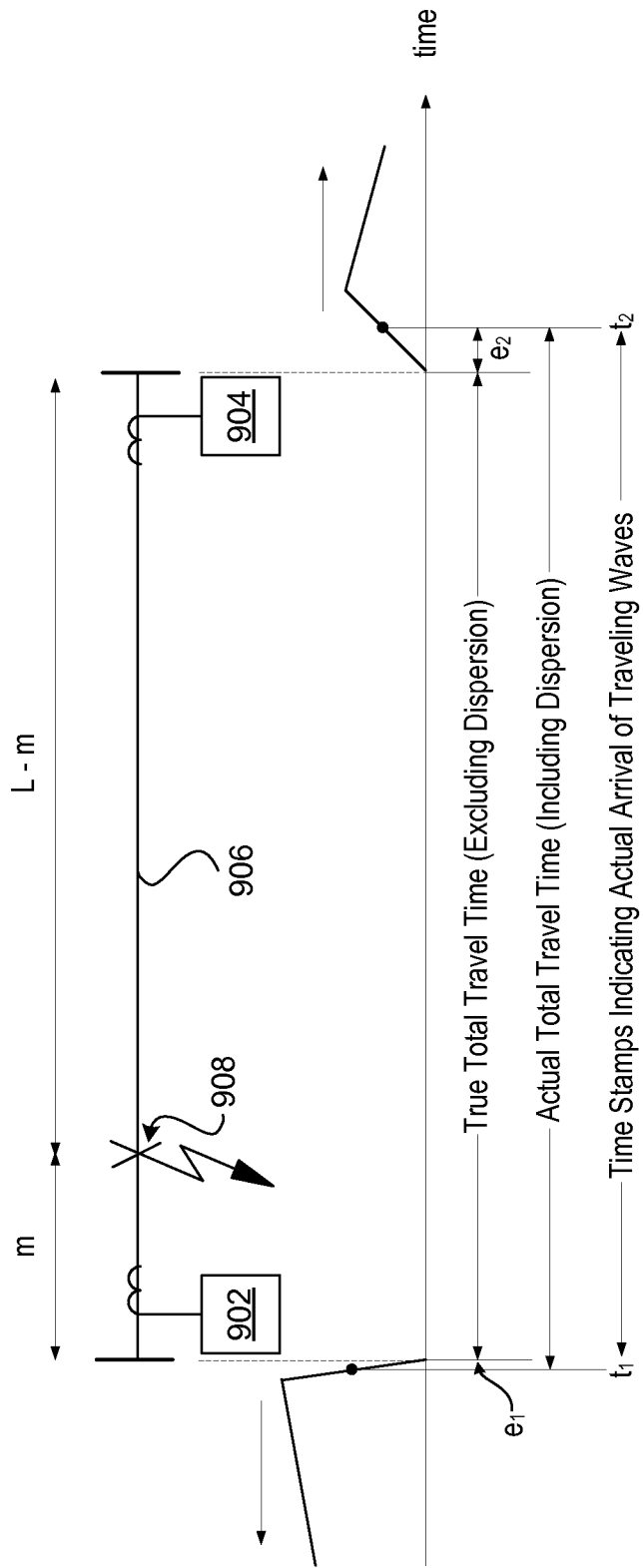
FIG. 9 illustrates a system configured to compensate for dispersion of a traveling wave as it propagates along an electrical transmission line consistent with certain embodiments of the present disclosure.

FIG. 9 illustrates a system configured to compensate for dispersion of a traveling wave as it propagates along an electrical transmission line consistent with embodiments of the present disclosure. Dispersion causes the front wave to spread out as it travels along the electrical transmission line. Dispersion, if uncorrected, may introduce additional uncertainty in a traveling wave fault location system.

Referring back to FIG. 7B and FIG. 7C, the initial current waveforms may be representative of a waveform having little dispersion and a waveform exhibiting considerable dispersion, respectively. The waveform illustrated in FIG. 7B illustrates a steep rising edge, and thus, a device that measures the waveform illustrated in FIG. 7B may be located proximate to the fault location. The waveform illustrated in FIG. 7C illustrates a more gentle rising edge in comparison to the waveform illustrated in FIG. 7B, and thus, the effect of greater dispersion may indicate that the device measuring the waveform illustrated in FIG. 7C is located farther from the fault location than the device that measured the waveform illustrated in FIG. 7B. The time stamp at the remote terminal (with dispersion) may appear late by an amount equal to half the difference in the ramp time between the two terminals according to certain embodiments.

Returning to a discussion of FIG. 9, a fault 908 is illustrated on a transmission line 906 having a length L. The fault occurs at a distance m from a first measurement device 902 and at a distance of L-m from a second measurement device 904. A true total travel time (i.e., the travel time in the transmission line 906 without dispersion) is indicated. An actual total travel time (i.e., the travel time in the transmission line 906 with dispersion) is also indicated. Time stamps $t_1$ and $t_2$ are illustrated, and errors or delay $e_1$ and $e_2$, which are attributable to dispersion are shown. As illustrated, the proximity of the fault 908 to the first measurement device 902 results in a signal with little dispersion. As a result of the greater distance between the fault 908 and the second measurement device 904, greater effects of dispersion result in a greater error or delay (i.e., $e_2$) between the true travel time and the actual travel time.

Figure 10:
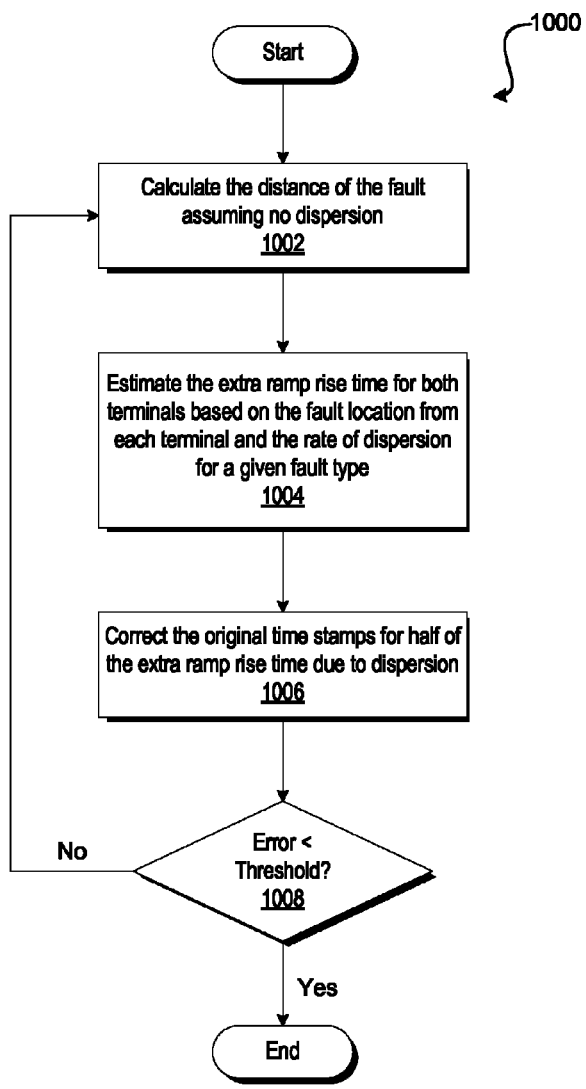
FIG. 10 illustrates one example of a method for determining dispersion based on a known rate of dispersion of a transmission line consistent with certain embodiments of the present disclosure.

FIG. 10 illustrates one example of a method 1000 for determining dispersion based on a known rate of dispersion of a transmission line consistent with certain embodiments of the present disclosure. Various embodiments consistent with the present disclosure may utilize several approaches to compensate for dispersion. At 1002, a distance to the fault may be calculated based on measurements associated with the fault and assuming no dispersion in the transmission line. At 1004, the extra ramp rise time may be estimated for both terminals based on the fault location and the rate of dispersion for a given fault type. The original time stamps may be corrected for dispersion at 1006. Corrected time stamps for half of the extra ramp rise time due to dispersion may be calculated using to Eq. 6.

$$t_{1CORR} = t_1 - e_1$$

$$t_{2CORR} = t_2 - e_2 \qquad \text{Eq. 6}$$

At 1008, method 1000 may determine whether an error (such as, for example, a difference between an original time stamp and a corrected time stamp) associated with dispersion is less than a threshold. If not, method 1000 may return to 1002 and the method may be repeated. Successive iterations of method 1000 may reduce the error associated with dispersion. Once the error is less than the threshold, method 1000 may end.

Figure 11:
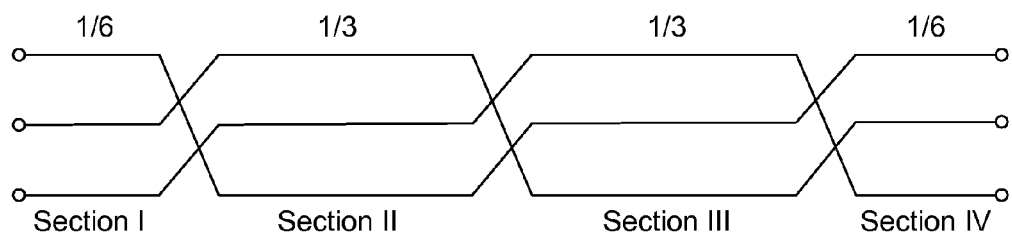
FIG. 11 shows a transmission line with three transpositions consistent with certain embodiments of the present disclosure.

FIG. 11 shows a transmission line with three transpositions consistent with various embodiments of the present disclosure. The rate of dispersion may be different in well-transposed lines and in non-transposed lines. In addition, the rate of dispersion may depend on the fault location and the resulting degree of transposition between the fault and each of the line terminals. Compensation for dispersion, according to some embodiments, may involve use of specific tower configuration data of the transmission line.

Based on the location of the transpositions, the line may be divided into four sections. When a fault occurs, certain embodiments may identify the faulted section and fault type in order to provide compensation based on the line topology and faulted phase(s). Each section of a transmission line may have a different dispersion correction amount. For example, for a fault in Section I, the algorithm may calculate the arrival times using a $DF_{SI\_L}$ factor (e.g. 1 ns/km) at the left terminal (terminal closest to the fault), and a $DF_{SI\_R}$ factor (e.g. 7.8 ns/km) at the right terminal.

Another method for compensating for dispersion may be implemented using an assumed linear relationship between dispersion and the traveled distance. The compensation can be achieved by applying an adjusted propagation velocity and using the same base fault locating equation. Referring to FIG. 9, the actual travel time of the wave may be expressed using Equation 7 and Equation 8.

$$t_1 = \frac{m}{v} + e_1 \quad \text{Eq. 7}$$

$$t_2 = \frac{L-m}{v} + e_2 \quad \text{Eq. 8}$$

Assuming the time stamping errors due to dispersion are proportional to the traveled distance (with a proportionality factor D), the error terms $e_1$ and $e_2$ may be expressed using Equation 9 and Equation 10.

$$e_1 = m \cdot D \quad \text{Eq. 9}$$

$$e_2 = (L-m) \cdot D \quad \text{Eq. 10}$$

Substituting Equations 9 and 10 into Equations 7 and 8 and solving for m yields Equation 11.

$$m = \frac{1}{2}\left[L + (t_1 - t_2) \cdot \frac{v}{1 + D \cdot v}\right] \quad \text{Eq. 11}$$

As may be noted, Equation 11 is similar to Equation 1, with the propagation velocity adjusted according to Equation 12.

$$v_{USED} = \frac{v_{REAL}}{1 + D \cdot v_{REAL}} \quad \text{Eq. 12}$$

The corrected velocity may be slightly lower than the actual propagation velocity because D is greater than 0. For example, assume dispersion of the ramp mid-point of 21s per 100 km (D=2 µs/100 km=$2 \cdot 10^{-11}$ s/m) and an actual propagation velocity of $0.9980 \cdot c$ (where c=299,792,458 m/s). The corrected velocity in this case would be $0.9921 \cdot c$. The value of D may depend on the fault type. Accordingly, various embodiments may apply different corrections for the phase and ground faults.

When measuring the velocity using a line energization test, a wave propagation velocity for phase to ground faults that is already corrected for the effect of dispersion may be obtained, assuming the rate of dispersion is the same for the entire line length. Similar compensation can be achieved for any fault type by taking into account multiple reflections (measuring the exact line length travel time observed for a given fault type).

Figure 12A:
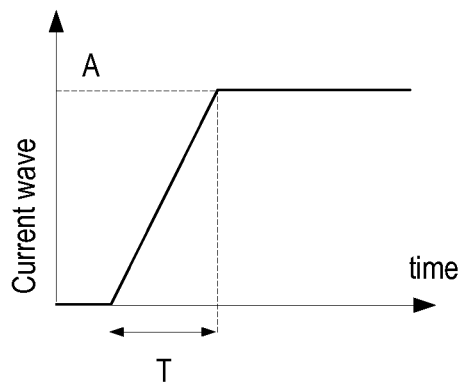
FIG. 12A illustrates a current wave input having a rising edge from 0 to an amplitude, A, over a time, T.
Figure 12B:
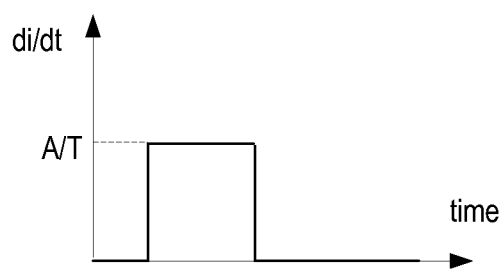
FIG. 12B illustrates the output of a differentiator consistent with embodiments of the present disclosure, where the input is the current wave illustrated in FIG. 12A.
Figure 12C:
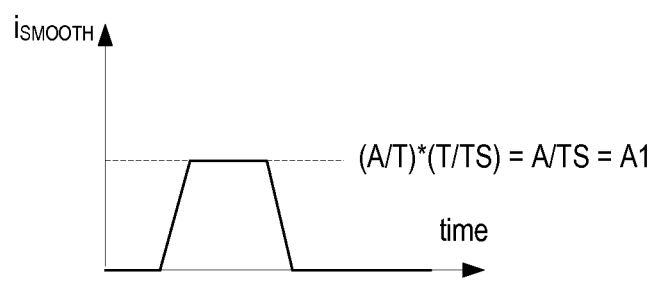
FIG. 12C illustrates an output of a smoother consistent with certain embodiments of the present disclosure, where the input is the output of the differentiator shown in FIG. 12B.

FIG. 12A illustrates a current wave input having a rising edge from 0 to an amplitude, A, over a time, T. For a current waveform caused by a fault, dispersion is the primary source of the ramp. In other words, without dispersion the wave would be a step change. FIG. 12B illustrates the output of a differentiator, where the input is the current wave illustrated in FIG. 12A. FIG. 12C illustrates an output of a smoother, where the input is the output of the differentiator shown in FIG. 12B. The smoother is an average with the window of TS, as expressed in Equation 13.

$$i_{SMOOTH} = \frac{1}{TS}\int_{t-TS}^{t}\left(\frac{di}{dt}\right)dt \quad \text{Eq. 13}$$

Figure 12D:
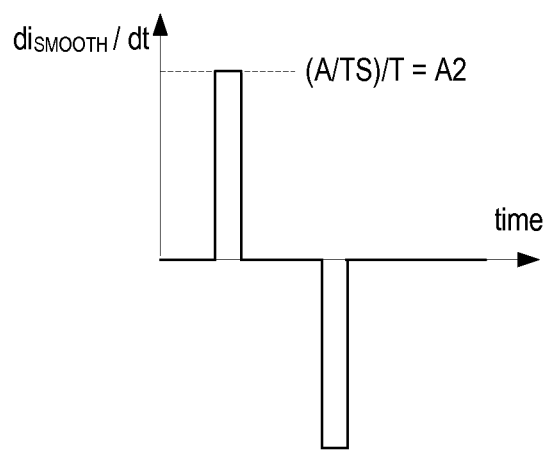
FIG. 12D illustrates the derivative of the smoothed waveform illustrated in FIG. 12C consistent with certain embodiments of the present disclosure.

Finally, FIG. 12D illustrates the derivative of the smoothed waveform illustrated in FIG. 12C.

A fault location system utilizing a differentiator-smoother processing a traveling wave may introduce a delay of approximately half of the ramp time of the wave. Accordingly, dispersion can be compensated for if the ramp time of the traveling wave were known. Moreover, the differentiator-smoother delay/error may be caused by the ramp time regardless of the source of the ramp. Accordingly, the method that eliminates or minimizes this error may be beneficial in a wider context than just compensating for dispersion.

Returning to FIG. 12A, compensating for dispersion may be based upon the value of T. When the output of the smoother (i.e., Equation 13) is at its maximum, the signal has a magnitude of $$\frac{T}{TS}.$$

The peak value in FIG. 12C given as $$\frac{A}{T} * \frac{T}{TS} = \frac{A}{TS},$$

because the input pulse has the magnitude of $$\frac{A}{T}.$$

This peak value may be denoted as A1. The peak value of the of signal shown in FIG. 12D has a peak value of $$\frac{A1}{T},$$

and may be denoted as A2.

The values of A1 and A2 may be easily measured, and T may be calculated from A1 and A2, as indicated in Equation 14.

$$T = \frac{A1}{A2} \qquad \text{Eq. 14}$$

Accordingly, the ratio of the peak amplitude of the output from the smoother (shown in FIG. 12C) to the peak magnitude of the derivative of the output from the smoother (shown in FIG. 12D) approximates the value of the ramp time in the input current wave (shown in FIG. 12A). According to other embodiments, the value of T may be obtained using the ratio of the peak value of the input wave to the peak value of the output from the differentiator.

In some embodiments, Equation 14 may further include a design constant, K, that may be dependent on a sampling frequency and other parameters of the differentiator and smoother. Accordingly, in such embodiments, Equation 15 may be used in place of Equation 14.

$$T = k * \frac{A1}{A2} \qquad \text{Eq. 15}$$

Figure 13:
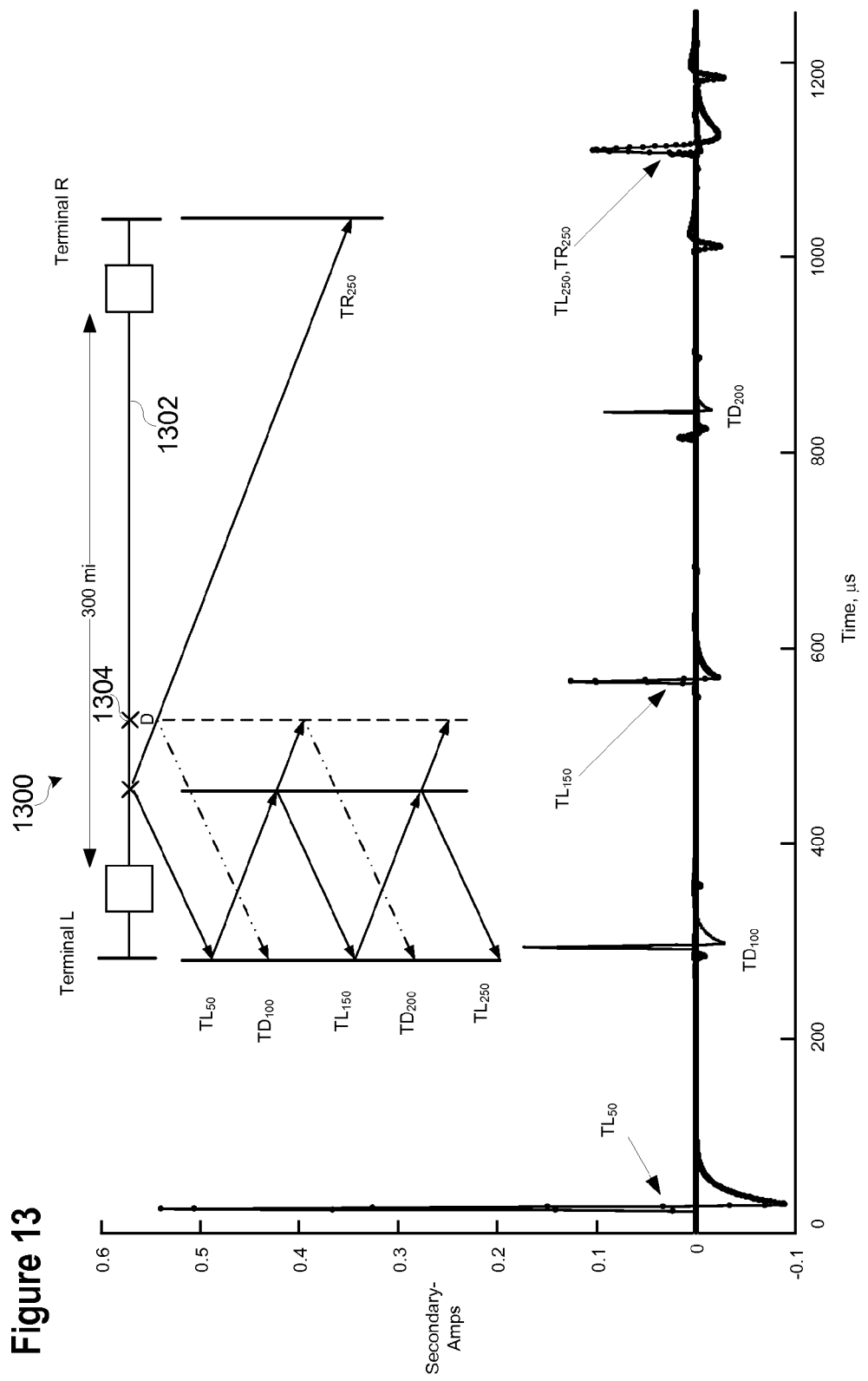
FIG. 13 illustrates a fault location system operating on a transmission line having a known impedance discontinuity that may be used to establish additional time windows for traveling wave reflections consistent with certain embodiments of the present disclosure.

FIG. 13 illustrates a fault location system 1300 operating on a transmission line 1302 having a known impedance discontinuity 1304 that may be used to establish additional time windows for traveling wave reflections consistent with various embodiments of the present disclosure. A known impedance discontinuity may include, for example, a transition from overhead to an underground section, a normally open line tap, significant and abrupt change in the tower configuration or anything else that causes a measureable reflection.

The fault location system illustrated in FIG. 13 may establish time windows for reflections from the known discontinuity 1304 similar to the process described above in connection with FIG. 2. Various embodiments may establish time windows for reflections from known discontinuities both with and without an impedance-based initial estimate, for single-end and two-end based methods, and can be combined with nonlinear optimization techniques described herein.

Known discontinuities may, according to certain embodiments, be used to adaptively compensate for line length, travel time or wave propagating speed variations caused by varying conductor temperature. Conductor temperature changes under the influence of weather and line current. For example, heavily loaded (hot) lines may sag, effectively increasing the physical conductor length. Such a change may impact the line length, the line impedance, and the propagation time, all of which may result in measurable changes to the actual travel time of a traveling wave on a transmission line. A discontinuity at a known point on the transmission line may help to compensate for the line length variation and fault-type related dispersion effect discussed above.

Adjusting parameters in a fault location system using a reflection from a known discontinuity may provide greater accuracy than measurements from a more distant IED. Proximity to the discontinuity may reduce the impact of line parameters when compared to measurements received from a more remote terminal.

Figure 14:
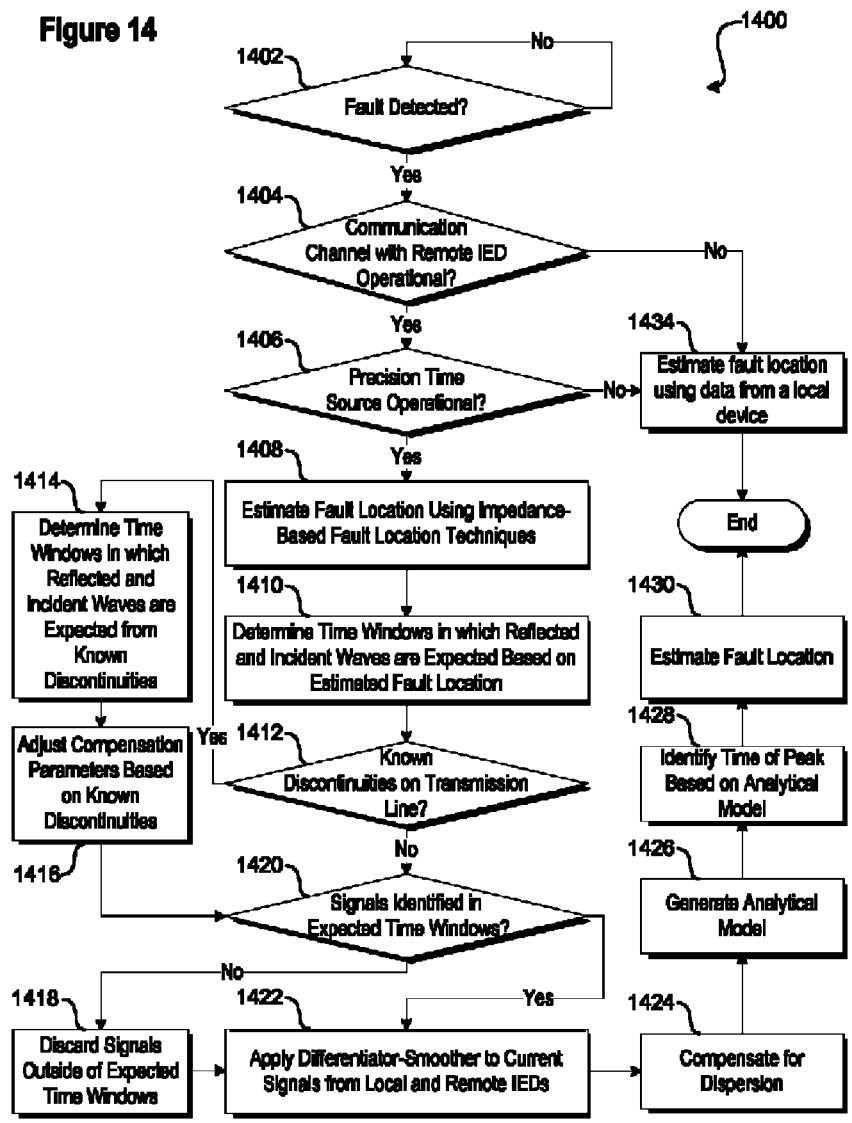
FIG. 14 illustrates a flow chart of a method for estimating a fault location using traveling waves consistent with certain embodiments of the present disclosure.

FIG. 14 illustrates a flow chart of a method 1400 for estimating a fault location using traveling waves consistent with the present disclosure. At 1402, method 1400 may wait for a fault to be detected. When a fault is detected, at 1404, method 1400 may determine whether a communication channel with a remote IED is operational. As discussed above, various embodiments may utilize information from a remote device in order to estimate a fault location. Further, at 1406, method 1400 may determine whether a precision time source is operational. Information from the precision time source may allow various embodiments to estimate the location of the fault more accurately using time stamped information received from the remote device. If either the communication channel or the precision time source are not operational, at 1434, method 1400 may estimate a fault location using data from the local device.

If the communication channel and the precision time source are operational, at 1408, an estimate of the fault location may be generated using impedance-based fault location techniques. As discussed above, impedance-based method may provide an estimate that is accurate to approximately ±3%. The estimated fault location may be used at 1410 to determine time windows in which waves are expected. As described above, the time windows may allow the system to more accurately rely on measurements corresponding to traveling waves. At 1412, method 1400 may determine whether known discontinuities are present on the transmission line. If so, at 1414, additional time windows in which traveling waves are expected from known discontinuities may be determined. Further, at 1416, adjustments may be made to compensation parameters (e.g., line length, line impedance, propagation time, etc.).

At 1420, method 1400 may determine whether signals associated with traveling waves are in the expected time windows. Signals outside of expected time windows may be discarded at 1418. At 1422, signals in the expected time windows may be applied to a differentiator-smoother as described herein. At 1424, the output of the differentiator-smoother may be used to compensate for dispersion.

Method 1400 may generate an analytical model based on the data at 1426. As described herein, the analytical model, according to some embodiments, may comprise a parabola fit to the data using a LES method. Other embodiments may utilize other functions that may most accurately fit the data. Analytical models may be generated based on data from a local source and data from a remote source. Using the analytical model, at 1428, a time of a peak of the traveling wave may be identified. Using the information regarding the peak of the traveling wave, an estimated fault location may be determined at 1430.

Figure 15:
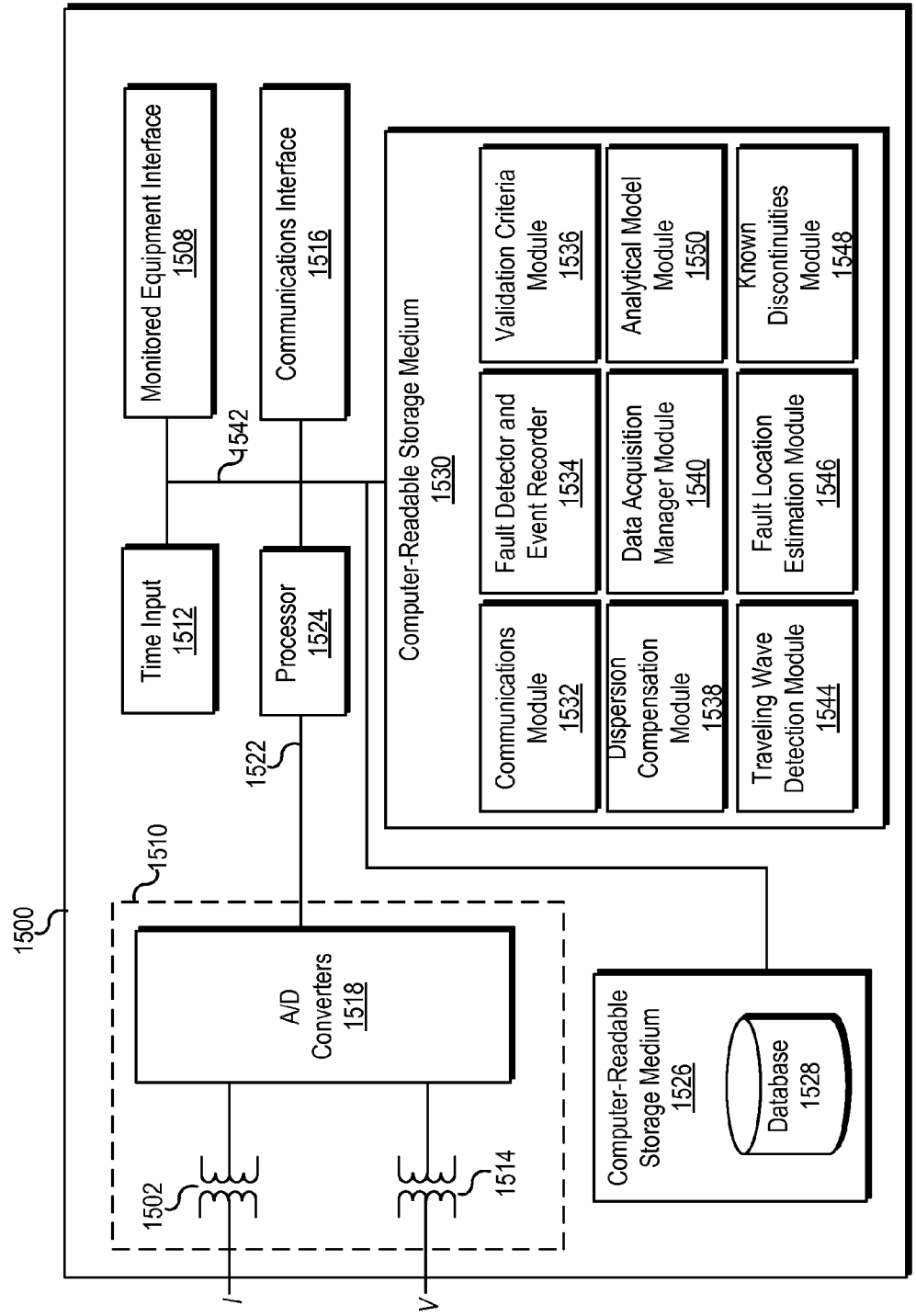
FIG. 15 illustrates a functional block diagram of a system 1500 for detecting faults and estimating a fault location using traveling waves consistent with certain embodiments of the present disclosure.

FIG. 15 illustrates a functional block diagram of a system 1500 for detecting faults and estimating a fault location using traveling waves consistent with embodiments of the present disclosure. In certain embodiments, the system 1500 may comprise an IED system configured to, among other things, detect faults using traveling waves and estimate a location of the fault. System 1500 may be implemented in an IED using hardware, software, firmware, and/or any combination thereof. Moreover, certain components or functions described herein may be associated with other devices or performed by other devices. The specifically illustrated configuration is merely representative of one embodiment consistent with the present disclosure.

IED 1500 includes a communications interface 1516 configured to communicate with other IEDs and/or system devices. In certain embodiments, the communications interface 1516 may facilitate direct communication with another IED or communicate with another IED over a communications network. Communications interface 1516 may facilitate communications with multiple IEDs. IED 1500 may further include a time input 1512, which may be used to receive a time signal (e.g., a common time reference) allowing IED 1500 to apply a time-stamp to the acquired samples. In certain embodiments, a common time reference may be received via communications interface 1516, and accordingly, a separate time input may not be required for time-stamping and/or synchronization operations. One such embodiment may employ the IEEE 1588 protocol. A monitored equipment interface 1508 may be configured to receive status information from, and issue control instructions to, a piece of monitored equipment (such as a circuit breaker, conductor, transformer, or the like).

Processor 1524 may be configured to process communications received via communications interface 1516, time input 1512, and/or monitored equipment interface 1508. Processor 1524 may operate using any number of processing rates and architectures. Processor 1524 may be configured to perform various algorithms and calculations described herein. Processor 1524 may be embodied as a general purpose integrated circuit, an application specific integrated circuit, a field-programmable gate array, and/or any other suitable programmable logic device.

In certain embodiments, IED 1500 may include a sensor component 1510. In the illustrated embodiment, sensor component 1510 is configured to gather data directly from equipment such as a conductor (not shown) and may use, for example, transformers 1502 and 1514 and A/D converters 1518 that may sample and/or digitize filtered waveforms to form corresponding digitized current and voltage signals provided to data bus 1522. Current (I) and voltage (V) inputs may be secondary inputs from instrument transformers such as, CTs and VTs. A/D converters 1518 may include a single A/D converter or separate A/D converters for each incoming signal. A current signal may include separate current signals from each phase of a three-phase electric power system. A/D converters 1518 may be connected to processor 1524 by way of data bus 1522, through which digitized representations of current and voltage signals may be transmitted to processor 1524. In various embodiments, the digitized current and voltage signals may be used to calculate the location of a fault on an electric power line as described herein.

A computer-readable storage medium 1526 may be the repository of a database 1528 containing electric power line properties for each transmission line and/or each section of each transmission line, such as impedances, resistances, propagation times, reactances, lengths, and/or the like. Another computer-readable storage medium 1530 may be the repository of various software modules configured to perform any of the methods described herein. A data bus 1542 may link monitored equipment interface 1508, time input 1512, communications interface 1516, and computer-readable storage mediums 1526 and 1530 to processor 1524.

Computer-readable storage mediums 1526 and 1530 may be separate mediums, as illustrated in FIG. 15, or may be the same medium (i.e. the same disk, the same non-volatile memory device, or the like). Further, the database 1528 may be stored in a computer-readable storage medium that is not part of the IED 1500, but that is accessible to IED 1500 using, for example, communications interface 1516.

Communications module 1532 may be configured to allow IED 1500 to communicate with any of a variety of external devices via communications interface 1516. Communications module 1532 may be configured for communication using a variety of data communication protocols (e.g., Ethernet, IEC 61850, etc.).

Fault detector and event recorder 1534 may collect data samples of a traveling wave current. The data samples may be associated with a timestamp and made available for retrieval and/or transmission to a remote IED via communications interface 1516. Traveling waves may be measured and recorded in real-time, since they are transient signals that dissipate rapidly in an electric power delivery system. Data acquisition manager module 1540 may operate in conjunction with fault detector and event recorder 1534. Data acquisition manager module 1540 may control recording of data relating to a travelling wave. According to one embodiment, data acquisition manager module 1540 may selectively store and retrieve data and may make the data available for further processing.

A validation criteria module 1536 may be configured to generate an initial estimate of a fault location. According to some embodiments, the initial estimate of the fault location may be performed using an impedance-based technique. A wide variety of impedance-based fault location systems may be used in connection with the present disclosure, including single-end fault location systems, and multi-end single-end fault location systems, different polarization single-end fault location systems, fault location systems that utilize only negative-sequence signals, fault location systems that utilize negative-sequence signals and zero-sequence signals, fault location systems using remote currents only, fault location signals using remote currents and voltages, fault location systems using remote signals that are time aligned with respect to the local signals, fault location systems using remote signals not time aligned with respect to the location signals, etc.

According to one embodiment, the validation criteria module may be configured to determine one or more observation windows in which travelling waves are expected based upon an initial estimate of a fault location. The validation criteria module 1536 may further be configured to identify measurements occurring outside of the expected time windows and to selectively discard such measurements.

A dispersion compensation module 1538 may be configured to compensate for dispersion of a traveling wave propagating along the electrical transmission line. Dispersion compensation module 1538 may be configured to implement the various techniques described herein for correcting an error or delay associated with dispersion. For example, dispersion compensation module 1538 may implement the methods described in connection with FIGS. 9-12, above.

Traveling wave detection module 1544 may detect traveling waves and record data values associated with the detected traveling waves (e.g., polarities, peak amplitudes, slopes, wave arrival, and the like). According to one embodiment, the traveling wave detection module 1544 detects a time of arrival of a traveling wave using a differentiator-smoother method as described herein.

Fault location estimation module 1546 may be configured to estimate a fault location based upon analysis of data regarding traveling waves. According to various embodiments, fault location estimation module 1546 may rely on one or more approaches for calculating the location of a fault. Fault location estimation module 1546 may be configured to rely on fault detection techniques described herein. More specifically, fault location estimation module 1546 may be configured to implement a digitized embodiment of a differentiator-smoother, as discussed herein. Fault location estimation module 1546 may be configured to utilize information from two terminals, when such information is available, and to estimate a fault location using information from only one terminal if necessary.

Known discontinuities module 1548 may make adjustments to compensation parameters (e.g., line length, line impedance, propagation time, etc.) based upon measurements associated with one or more known discontinuities. As described above, physical conditions (e.g., weather) and electrical conditions (e.g., the load connected to a transmission line) may affect the physical properties of the line. Known discontinuities module 1548 may be configured to analyze data associated with a known discontinuity and adjust various parameters based on such measurements.

An analytical model module 1550 may be configured to generate an analytical model based upon a plurality of measurements associated with a traveling wave. According to one embodiment, the analytical model may include a parabola that is fitted to measure values using a LES method. Other embodiments may fit the data using other polynomials or other functions. The analytical model module 1550 may further be configured to analyze the model to identify a peak value and a time associated with the peak value. As described herein, the peak value may be used in estimating the location of a fault that created the traveling wave.

While specific embodiments and applications of the disclosure have been illustrated and described, it is to be understood that the disclosure is not limited to the precise configurations and components disclosed herein. For example, the systems and methods described herein may be applied to an industrial electric power delivery system or an electric power delivery system implemented in a boat or oil platform that may not include long-distance transmission of high-voltage power. Moreover, principles described herein may also be utilized for protecting an electrical system from over-frequency conditions, wherein power generation would be shed rather than load to reduce effects on the system. Accordingly, many changes may be made to the details of the above-described embodiments without departing from the underlying principles of this disclosure. The scope of the present invention should, therefore, be determined only by the following claims.

What is claimed is:

1. A system for monitoring an electric power delivery system by detecting a fault using traveling waves, comprising:
   a sensor component in electrical communication with the electric power delivery system configured to obtain electrical signals from the electric power delivery system and to generate electrical measurements from the electrical signals, the electrical measurements each associated with a time stamp;
   a non-transitory computer-readable storage medium comprising parameters of the electrical power delivery system including known discontinuities of the electric power delivery system and a line length of the electric power delivery system;
   a traveling wave detection module configured to detect a traveling wave and a reflection of the traveling wave using the electrical measurements; and
   a known discontinuities module configured to:
      associate the reflection of the traveling wave with a known discontinuity; and,
      adjust the line length of the electrical power delivery system using the measurements associated with the reflection of the traveling wave based on the known discontinuity;
   wherein the traveling wave detection module is further configured to calculate a location of the fault on the electric power delivery system using the measurements associated with the traveling wave and the adjusted line length.

2. A method for detecting faults on an electrical transmission line in an electric power delivery system, comprising:
   detecting at a first terminal of the electric power delivery system, a traveling wave associated with a fault;
   detecting at the first terminal of the electric power delivery system, a reflection of the traveling wave from a known discontinuity in the electrical transmission line;
   a first intelligent electronic device (IED) receiving measurements associated with the traveling wave detected at the first terminal and the reflection of the traveling wave from the known discontinuity detected at the first terminal, the measurements including time stamps;
   adjusting a parameter associated with the electrical transmission line using the measurements associated with the reflection of the traveling wave based on the known discontinuity; and,
   calculating a location of the fault on the electrical transmission line using the measurements associated with the traveling wave and the adjusted parameter.

3. The method of claim 2, wherein the adjusted parameter comprises one selected from the group consisting of an adjusted line length, a wave propagation velocity, and combinations thereof.

4. The method of claim 2, wherein the known discontinuity comprises an impedance discontinuity.

5. The method of claim 2, wherein the known discontinuity comprises one selected from the group consisting of: a transition from overhead to underground section; and a normally open line tap; a change in tower configuration.

6. The method of claim 2, further comprising:
   detecting at a second terminal of the electric power delivery system, the traveling wave associated with the fault; and,
   receiving measurements associated with the traveling wave detected at the second terminal, the measurements including time stamps;
   wherein the fault is between the first and second terminals.

7. The method of claim 6, wherein the step of calculating the location of the fault comprises using measurements associated with the traveling wave detected at the first terminal and at the second terminal.

8. The method of claim 2, further comprising:
   generating an initial location of the fault using the measurements;
   establishing validation criteria for the first terminal based on the initial location of the fault; and,
   identifying measurements that satisfy the validation criteria for the first terminal;
   wherein adjusting the parameter associated with the electrical transmission line uses the identified measurements of the received measurements that satisfy the validation criteria for the first terminal.

9. The method of claim 8, wherein the validation criteria comprises time windows in which the traveling wave and the reflection of the traveling wave would be expected to arrive at the first terminal.

10. The method of claim 8, wherein adjusting the parameter associated with the electrical transmission line uses the identified measurements of the received measurements that satisfy the validation criteria for the first terminal.

11. The method of claim 8, wherein calculating a location of the fault uses the identified measurements of the received measurements that satisfy the validation criteria for the first terminal.

12. The method of claim 2, further comprising:
   extracting high-frequency content from the measurements using a differentiator;
   refining the measurements using a smoother;
   determining a peak and a time of the peak of the traveling wave detected at the first terminal from the filtered measurements; and,
   wherein the peak and the time of the peak are used for calculating the location of the fault.

13. The method of claim 2, further comprising:
generating an initial location of the fault using the received measurements;
calculating a dispersion of the traveling wave at the first terminal using the initial location of the fault and a rate of dispersion of the transmission line; and,
correcting the time stamps of the measurements associated with the traveling wave based on the calculated dispersion at the first terminal;
wherein the corrected time stamps are used in calculating the location of the fault.

14. A system for monitoring an electric power delivery system by detecting a fault using traveling waves, comprising:
a sensor component in electrical communication with the electric power delivery system configured to obtain electrical signals from the electric power delivery system and to generate electrical measurements from the electrical signals, the electrical measurements each associated with a time stamp;
a non-transitory computer-readable storage medium comprising parameters of the electrical power delivery system including known discontinuities of the electric power delivery system;
a traveling wave detection module configured to detect a traveling wave and a reflection of the traveling wave using the electrical measurements; and
a known discontinuities module configured to:
associate the reflection of the traveling wave with a known discontinuity; and,
adjust a parameter of the electrical power delivery system using the measurements associated with the reflection of the traveling wave based on the known discontinuity;
wherein the traveling wave detection module is further configured to calculate a location of the fault on the electric power delivery system using the measurements associated with the traveling wave and the adjusted parameter.

15. The system of claim 14, wherein the adjusted parameter comprises one selected from the group consisting of an adjusted line length, wave propagation velocity, and a combination thereof.

16. The system of claim 14, wherein the known discontinuity comprises an impedance discontinuity.

17. The system of claim 14, wherein the known discontinuity comprises one selected from the group consisting of: a transition from overhead to underground section; and a normally open line tap; a change in tower configuration.

18. The system of claim 14, wherein the adjusted parameter comprises a dispersion rate of the electric power delivery system.

19. The system of claim 18, further comprising a dispersion compensation module configured to:
generate an initial location of the fault;
determine a dispersion of a traveling wave based on the initial location and the adjusted dispersion rate for the electric power delivery system; and
adjust the time stamps associated with the measurements based on the dispersion;
wherein the traveling wave detection module is configured to calculate the location of the fault using the adjusted time stamps.

20. The system of claim 18, wherein the dispersion compensation module is further configured to update the parameters of the electrical power delivery system with the adjusted dispersion rate.

21. The system of claim 14, wherein the traveling wave detection module is further configured to calculate the location of the fault in a timely manner for use in protection of the electric power delivery system.

* * * * *